(12) United States Patent
Yow et al.

(10) Patent No.: US 12,108,558 B2
(45) Date of Patent: Oct. 1, 2024

(54) CROSSTALK REGULATOR FOR CABLES

(71) Applicant: HEWLETT PACKARD ENTERPRISE DEVELOPMENT LP, Spring, TX (US)

(72) Inventors: See Yun Yow, Singapore (SG); Kai Siang Loh, Singapore (SG); Syonjian Ong, Singapore (SG)

(73) Assignee: Hewlett Packard Enterprise Development LP, Spring, TX (US)

( * ) Notice: Subject to any disclaimer, the term of this patent is extended or adjusted under 35 U.S.C. 154(b) by 115 days.

(21) Appl. No.: 18/049,324

(22) Filed: Oct. 25, 2022

(65) Prior Publication Data

US 2024/0138093 A1 Apr. 25, 2024
US 2024/0237261 A9 Jul. 11, 2024

(51) Int. Cl.
*H05K 7/14* (2006.01)
*H02G 3/22* (2006.01)
*H02G 15/007* (2006.01)

(52) U.S. Cl.
CPC ............ *H05K 7/1491* (2013.01); *H02G 3/22* (2013.01); *H02G 15/007* (2013.01)

(58) Field of Classification Search
CPC ....... H02G 3/22; H02G 15/007; H05K 7/1491
(Continued)

(56) References Cited

U.S. PATENT DOCUMENTS 3,092,360 A * 6/1963 Cook .................... F16L 5/00
174/153 G
3,135,535 A * 6/1964 Shepard ................ F16L 5/02
439/456

(Continued)

FOREIGN PATENT DOCUMENTS

CN  101685958 A * 3/2010 ............... H02G 3/22
CN  111725770 A * 9/2020 ............... H02G 3/22
(Continued)

OTHER PUBLICATIONS amazon.com, "Panduit CBOT24K Cable Organizing Kit, Took Kit Includes: Jacket Cover, Hook and Loop Fastener, Green Cable Organizing Insert, Yellow Cable Organizing Insert,", available online at <https://www.amazon.com/Panduit-CBOT24K-Cable-Organizing-Tool/dp/>, Sep. 8, 2010, 6 pages.
(Continued)

*Primary Examiner* — Taylor Morris
(74) *Attorney, Agent, or Firm* — Hewlett Packard Enterprise Patent Department

(57) ABSTRACT

A crosstalk regulator for a cabinet includes a cable management component having a ring portion surrounding a central axis and a plurality of teeth protruding radially outward from the ring portion. The teeth define a plurality of slots distributed around a circumference of the ring portion. Each slot is defined between a pair of adjacent teeth and extends parallel to the central axis. Each tooth includes a first portion and a second portion, the first portion protrudes farther radially outward from the ring portion than the second portion. The cable management component is slidably disposed in the cabinet such that the second portion is disposed in the opening and the first portion is engaged to the cabinet to releasably retain the crosstalk regulator in the cabinet. Each slot routes one cable between controlled and external environments while maintaining a fixed distance between adjacent cables to regulate crosstalk among the cables.

20 Claims, 17 Drawing Sheets

(58) Field of Classification Search
USPC .......................................................... 248/56
See application file for complete search history.

(56) References Cited

U.S. PATENT DOCUMENTS

| | | | | |
|---|---|---|---|---|
| 5,027,478 | A * | 7/1991 | Suhr ..................... | F16L 3/223 |
| | | | | 24/339 |
| 6,150,608 | A * | 11/2000 | Wambeke ............ | H02G 15/013 |
| | | | | 16/2.2 |
| 6,225,562 | B1 * | 5/2001 | Fujishita ............. | B60R 16/0222 |
| | | | | 174/152 G |
| 6,426,462 | B1 * | 7/2002 | Mignon ............... | G02B 6/4472 |
| | | | | 174/64 |
| 6,710,249 | B1 * | 3/2004 | Denton ................ | H02G 3/24 |
| | | | | 174/152 G |
| 7,318,567 | B2 | 1/2008 | Mori et al. | |
| 7,534,960 | B2 * | 5/2009 | Hendershot .......... | H02G 3/22 |
| | | | | 174/93 |
| 9,006,589 | B2 * | 4/2015 | Graef ................... | H02G 3/22 |
| | | | | 174/152 G |
| 9,112,339 | B2 * | 8/2015 | Millet .................. | H02G 3/0406 |
| 9,312,672 | B2 * | 4/2016 | Hill ...................... | H02G 3/083 |
| 9,719,614 | B2 * | 8/2017 | Blaser .................. | G02B 6/4444 |
| 9,768,604 | B2 * | 9/2017 | Vanhentenrijk ...... | H02G 15/013 |
| 2005/0263316 | A1 * | 12/2005 | Matsumoto ........... | H02G 3/32 |
| | | | | 174/113 R |
| 2007/0023198 | A1 * | 2/2007 | Van Noten ........... | H02G 3/083 |
| | | | | 174/93 |
| 2007/0246613 | A1 * | 10/2007 | Kennedy .............. | H02G 3/32 |
| | | | | 248/56 |
| 2013/0001893 | A1 * | 1/2013 | West .................... | F16L 5/14 |
| | | | | 277/637 |
| 2017/0108147 | A1 * | 4/2017 | Cindrich .............. | H02G 3/22 |

FOREIGN PATENT DOCUMENTS

| | | | | |
|---|---|---|---|---|
| DE | 29913754 U1 * | 10/1999 | ............. | H02G 11/00 |
| DE | 102010017440 A1 * | 12/2011 | ............... | F16L 5/02 |
| DE | 102012112510 A1 * | 6/2014 | ............... | F16L 5/02 |
| EP | 2214279 A2 * | 8/2010 | ........... | H02G 15/007 |
| KR | 20020047070 A * | 6/2002 | ........... | H02G 15/007 |

OTHER PUBLICATIONS amazon.com.au, "Cable Combs—Ethernet Comb, Wire Comb, Data Cable Comb Cat6 Cable Organizer, Cable Dressing Tool with Hook and Loop Fastener for Server Room and Machine Room Cable Management", available online at <https://www.amazon.com.au/Cable-Combs-Etherne>, Apr. 20, 2020, 5 pages.

Cable Dresser, "Cable Dresser CD-48", available onnline at <https://cabledresser.com/collections/frontpage/products/cable-dresser-cd-48>, Aug. 5, 2022, 2 pages.

ebay.com, "Network Module Cat 5/Cat 6 Network Cable Comb Machine Wire Harness Arrangement", available online at <https://www.ebay.com/itm/333884079133>, Mar. 19, 2021, 4 pages.

* cited by examiner

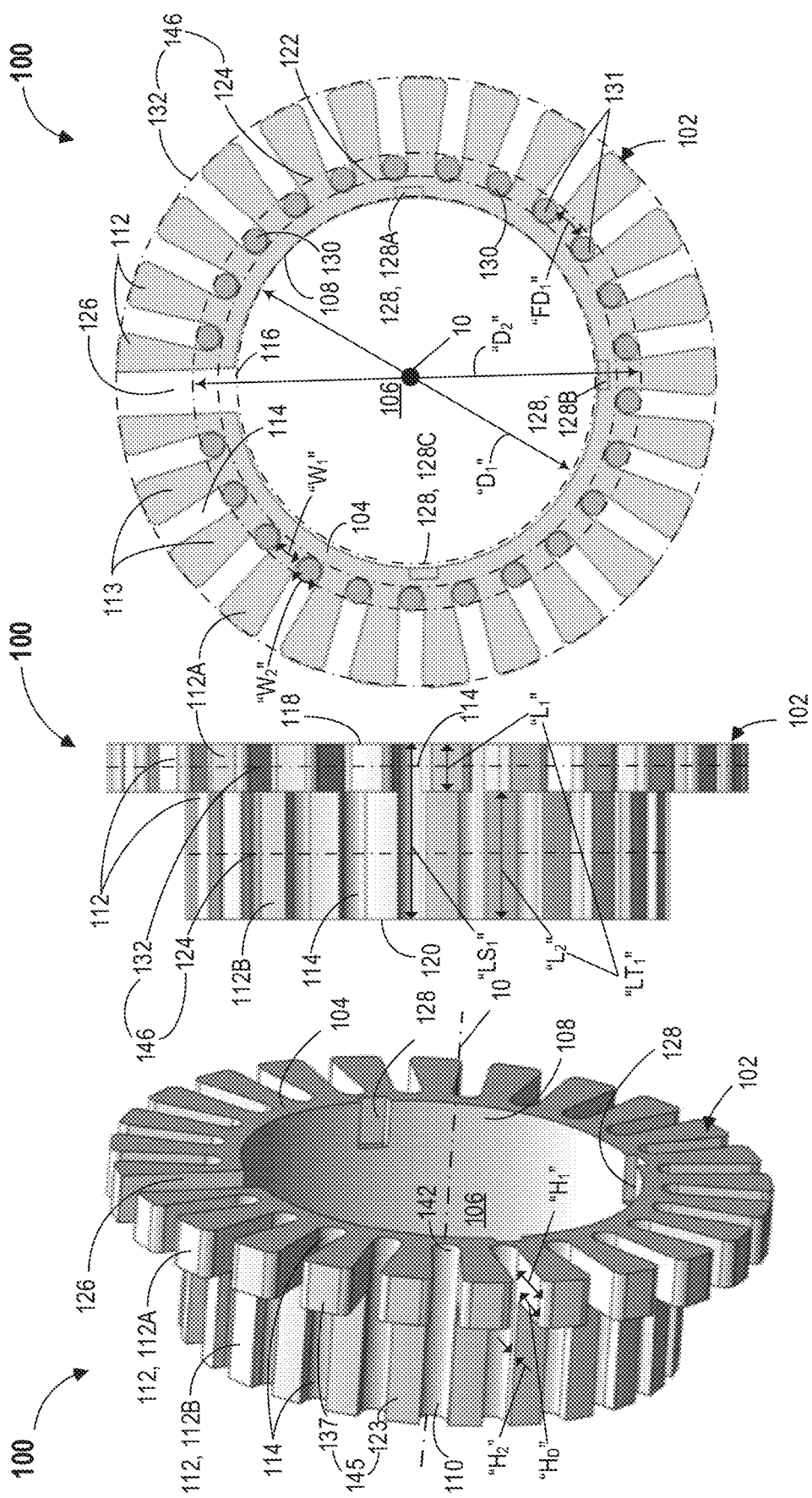

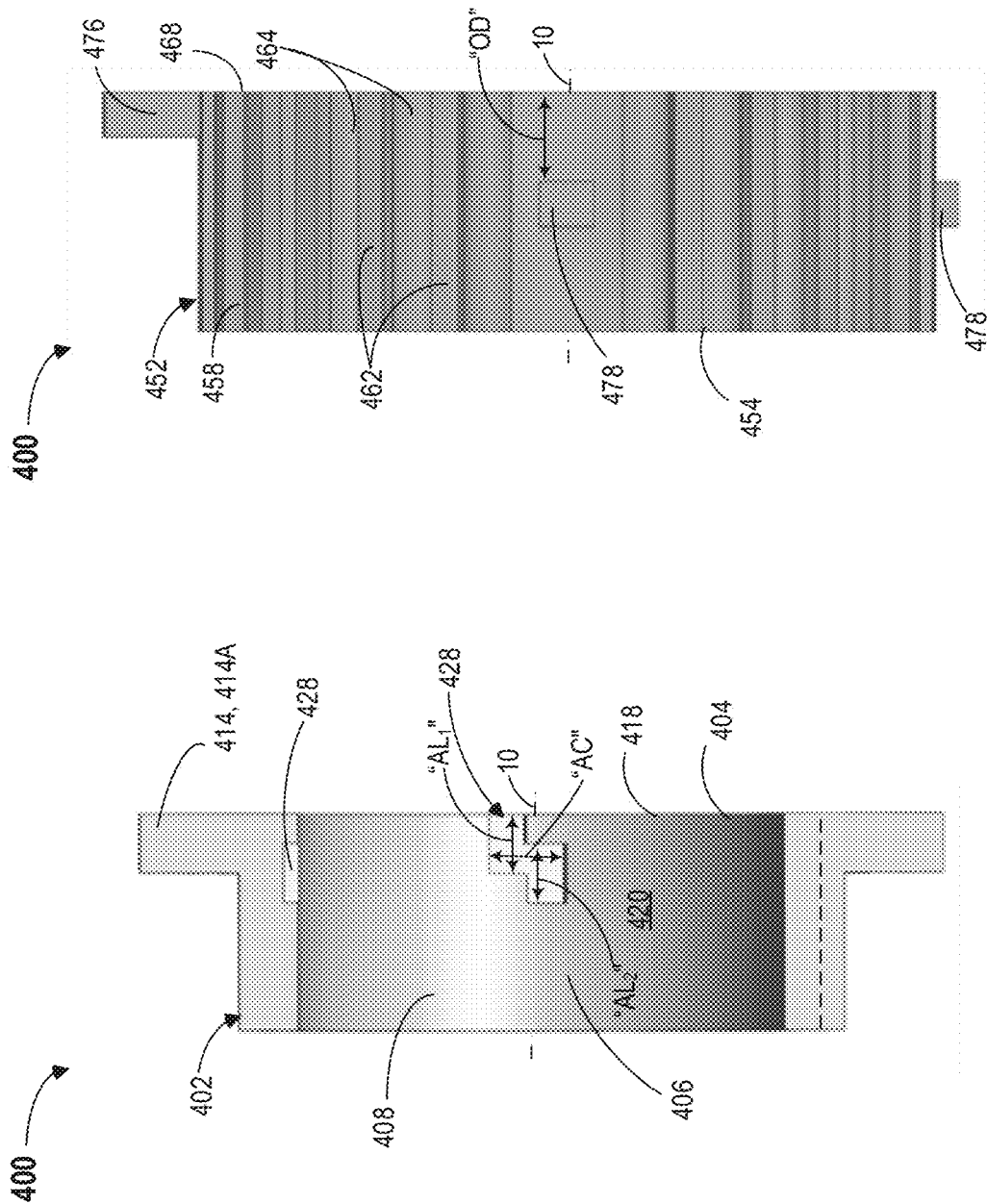

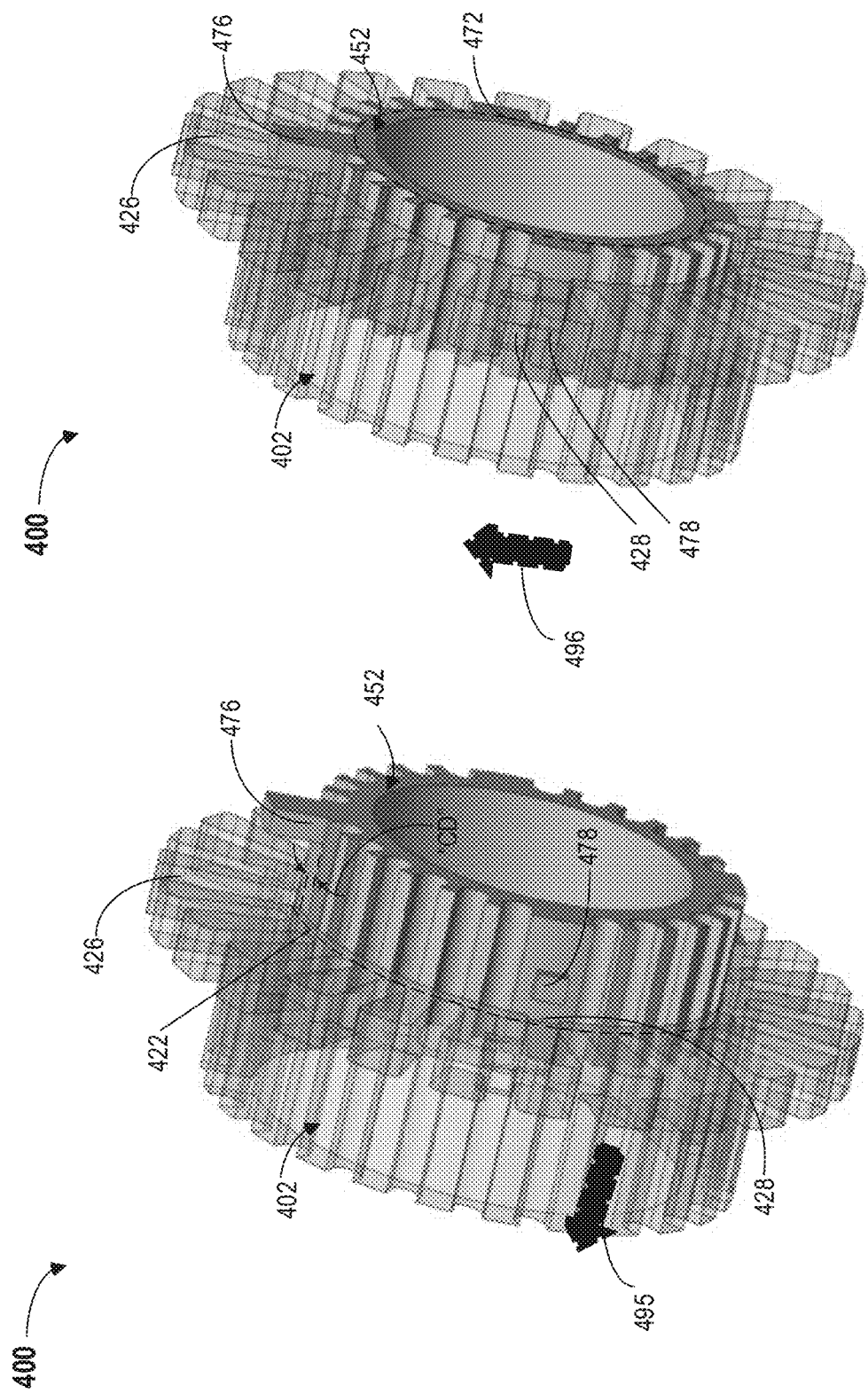

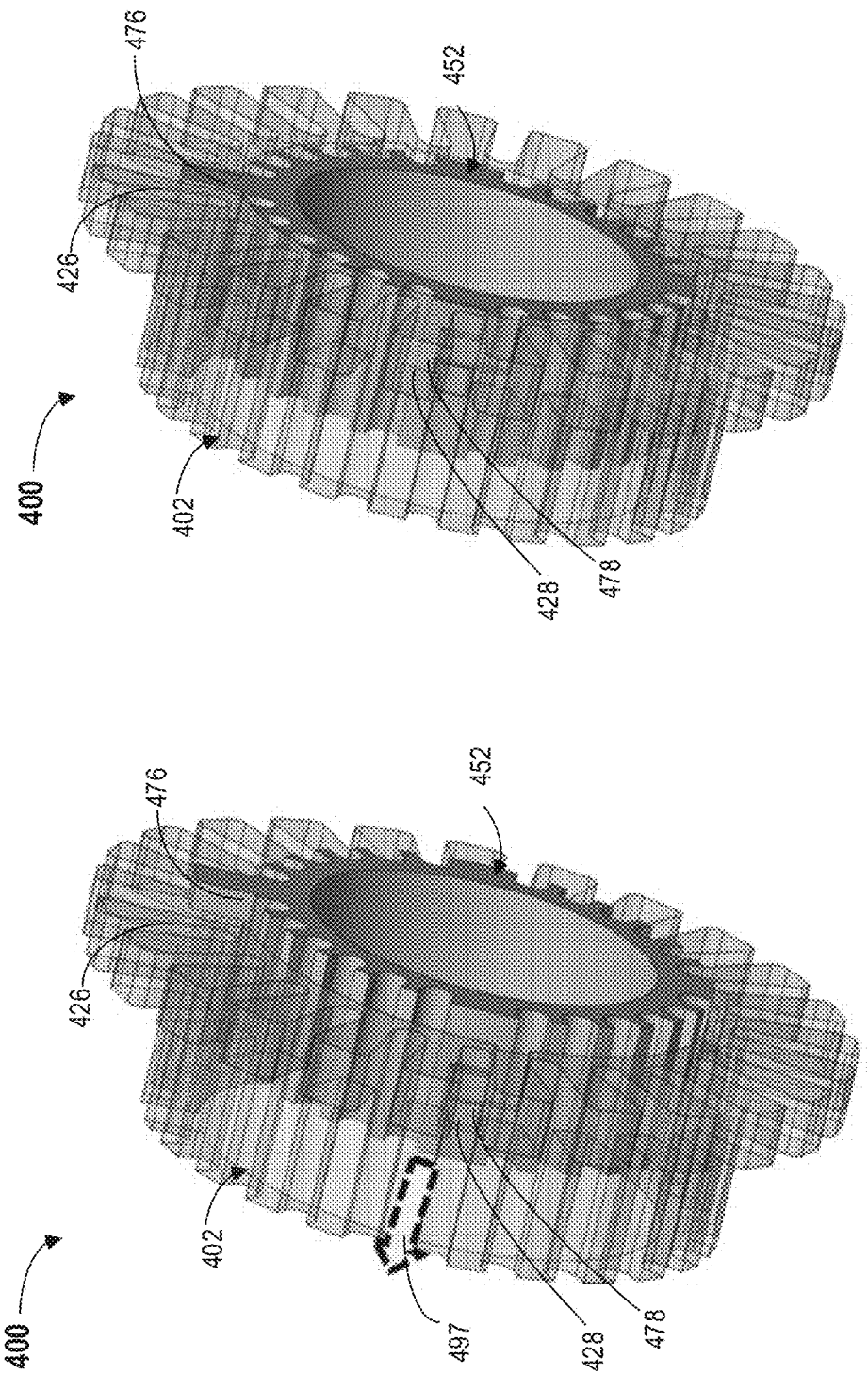

CROSSTALK REGULATOR FOR CABLES

BACKGROUND

Datacenters or other facilities in which computers or other electronic devices are deployed may include one or more cabinets to host electronic devices such as computers, networking devices, etc. Each cabinet includes an opening to route the cables from an environment inside the cabinet to an external environment. The electronic devices may be connected to the cables routed inside the cabinet to receive data from and/or transfer data to external electronic devices and receive power supply from one or more power supply sources that are disposed outside the cabinet. Generally, for ease of cable management, such cables are bundled together and routed inside the cabinet via the opening.

BRIEF DESCRIPTION OF THE DRAWINGS

Various examples will be described below with reference to the following figures.

FIG. 1A illustrates a perspective view of a cable management component of a crosstalk regulator according to an example of the present disclosure.

FIG. 1B illustrates a side view of the cable management component of FIG. 1A according to an example of the present disclosure.

FIG. 1C illustrates a front view of the cable management component of FIG. 1A having a plurality of cables according to an example of the present disclosure.

FIG. 8A illustrates a cross-section side view of a cable management component of a crosstalk regulator according to another example of the present disclosure.

FIG. 8B illustrates a side view of a second cable management component of a crosstalk regulator according to another example of the present disclosure.

FIG. 8C-8F illustrates a plurality of steps for slidably disposing and interlocking the second cable management component of FIG. 8B with the cable management component of FIG. 8A according to another example of the present disclosure.

DETAILED DESCRIPTION

Figures 2A, 2B, 2C:
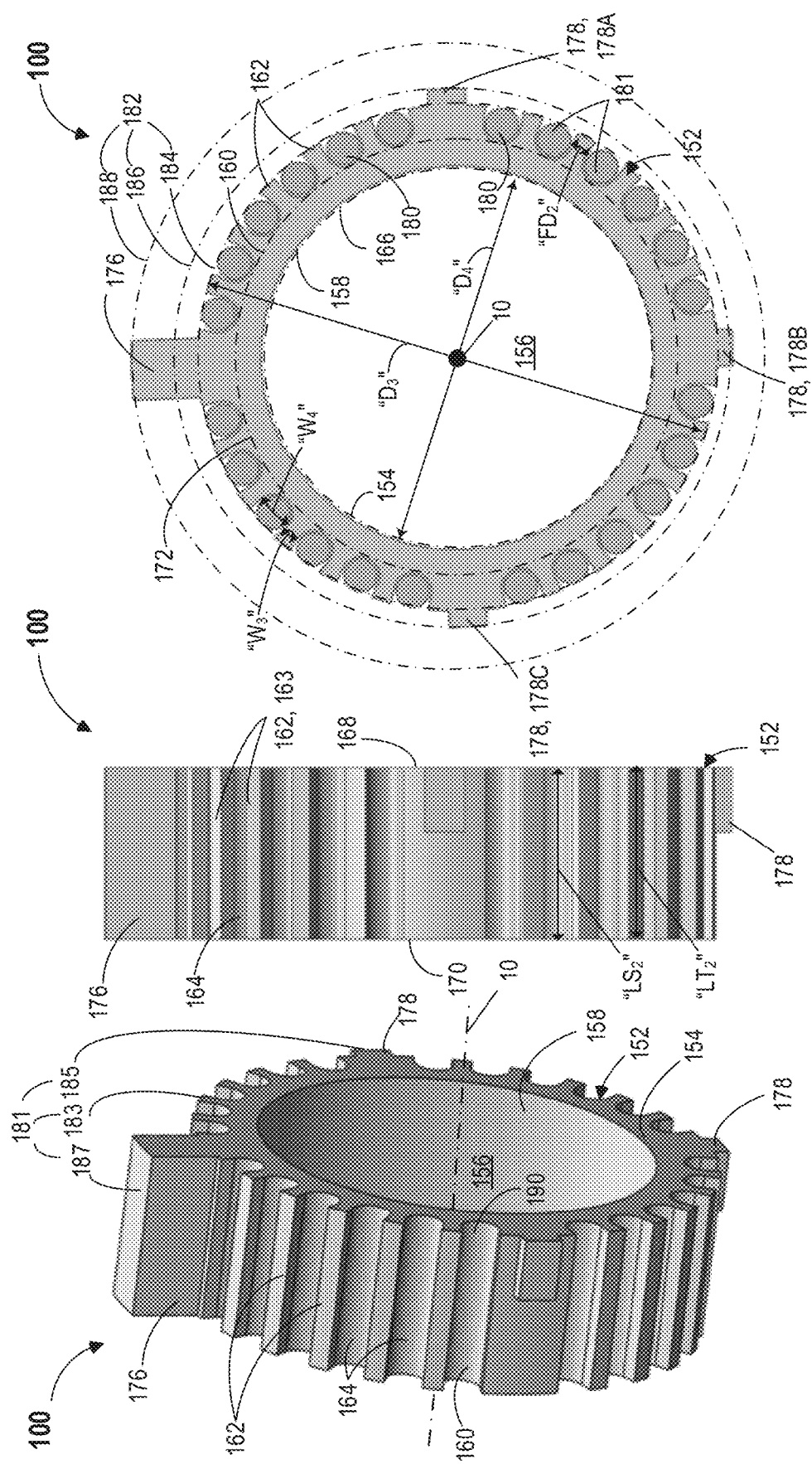
FIG. 2A illustrates a perspective view of a second cable management component of a crosstalk regulator according to an example of the present disclosure.
FIG. 2B illustrates a side view of the second cable management component of FIG. 2A according to an example of the present disclosure.
FIG. 2C illustrates a front view of the second cable management component of FIG. 2A having a plurality of second cables according to an example of the present disclosure.

The following detailed description refers to the accompanying drawings. For purposes of explanation, certain examples are described with reference to the components illustrated in FIGS. 1-9. The functionality of the illustrated components may overlap, however, and may be present in a fewer or greater number of elements and components. Moreover, the disclosed examples may be implemented in various environments and are not limited to the illustrated examples. Further, the sequence of assembly described in connection with FIG. 6A-6G is an example and is not intended to be limiting. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

As used herein, "controlled environment" refers to a regulated environment having one or more parameters such as temperature, air flow rate, etc., which are controlled to provide suitable operating conditions for the electronic devices. As used herein, "external environment" refers to unregulated environment, which is outside of the controlled environment. As used herein, "elongated tooth" refers to a protrusion having a length that exceeds its width. As used herein, "length" refers to a dimension defined along a central axis (or an axial direction) of a cable management component. As used herein, "elongated slot" refers to a recess having a length that exceeds its width. As used herein, "crosstalk" refers to unwanted transfer of data between adjacent communication channels, e.g., cables, or degrading the transmission of the data on the adjacent cables, or radiating and interfering with the data transmitted on adjacent cables.

Cabinets deployed in a datacenter or other facility may host multiple electronic devices such as computers (e.g., server devices, storage devices), networking devices (e.g., switches), etc., to execute workloads, transfer data and/or store data that are related to the workloads. Generally, each cabinet is maintained in a controlled environment (temperature, air flow, etc.) to provide a suitable operating conditions for the electronic devices hosted in the cabinet to operate. Therefore, each cabinet is sealed from an external environment to prevent leakage of air from the controlled environment to the external environment or transfer of heat between the controlled and external environments. However, each electronic device hosted in the cabinet needs to be connected to cables such as i) data cables to receive data from and/or transfer data to external electronic devices disposed outside of the cabinet and ii) power cables to receive power supply from one or more power supply sources of the datacenter. Therefore, an opening is formed in a wall of the cabinet to provision the cables to be routed from the external environment into the controlled environment. Generally, the cables are bundled together for ease of handling the cables, while routing the cables between the controlled and external environments via the opening. Further, such opening is sealed using a sealing component to regulate i) leakage of air between the controlled and external environments and/or ii) loss or gain of temperature between the controlled and external environments. However, the sealing component disposed in the opening to seal the cabinet may further squash the bundled cables at the opening. Since the cables are bundled together and squashed at the opening in the cabinet, crosstalk may occur between the cables when data are transmitted through such cables. For examples, the crosstalk occurs when the data transmitted on one cable i) radiates and interferes with the data transmitted on adjacent cables or ii) degrades the transmission of the data on the adjacent cables. In other words, the crosstalk among the cables may cause data packet drops and transmission losses in the plurality of cables. Hence, the crosstalk among the cables may negatively affect performances of the electronic devices (e.g., switches) and may be undesirable when transmitting the data at high speeds (e.g., above 2.5 gigabits per second). Further, the sealing component may induce stress on the bundled cables at the opening, which may result in splitting of one or more cables. Since the cables are bundled together, identifying one or more faulty cables from the bundle of cables and replacing them with one or more new cables may be laborious and time consuming task.

A technical solution to the aforementioned problems includes providing a crosstalk regulator, which may be disposed in an opening (e.g., an exit hole) formed on a sidewall of a cabinet to route a plurality of cables between a controlled environment of the cabinet and an external environment via the opening while maintaining a fixed distance between adjacent cables to prevent crosstalk among the plurality of cables. The crosstalk regulator includes a cable management component having a ring portion surrounding a central axis and a plurality of teeth protruding radially outward from the ring portion. The teeth define a plurality of slots distributed around a circumference of the ring portion. Each of the slots is defined between a pair of adjacent teeth of the plurality of teeth and extends in length parallel to the central axis. Hence, each tooth may maintain a space between adjacent slots. Accordingly, each slot which is spaced apart from the adjacent slots by the pair of adjacent teeth, may receive one cable of a plurality of cables such that the plurality of slots route the plurality of cables between the controlled and external environments while maintaining the fixed distance between adjacent cables of the plurality of cables to regulate crosstalk among the plurality of cables. Thus, the crosstalk regulator may maintain sufficient fixed distance between adjacent cables to regulate crosstalk among the cables and create a stress free path for cables to route between the controlled and external environments via the opening.

In one or more examples, each slot is recessed radially inwards from radially outward facing surfaces of the teeth, with a bottom surface of each slot corresponding to an outer surface of the cable management component. Further, each slot and each tooth extend in length parallel to the central axis between a first end portion and a second end portion of the cable management component. Each of the teeth includes a first portion and a second portion. The first portion of each tooth is located at the first end portion of the cable management component and the second portion of each tooth is located between the second end portion and the first portion of the corresponding tooth. The first portion protrudes farther radially outward from the ring portion than the second portion. More specifically, in some examples, the second portions of the teeth are dimensioned so as to fit within the opening, whereas the first portions of the teeth are dimensioned to not fit within the opening. Accordingly, when the cable management component is slidably disposed in the opening, at least part of the second portion of each tooth is disposed in the opening and the first portion of each tooth remains outside the opening and engaged to the sidewall to releasably retain the crosstalk regulator in the cabinet. Further, each slot may remain accessible from the front end portion of the cable management component to route one cable among the plurality of cables between the controlled and external environments via the opening. Moreover, when the cable management component is disposed in the opening, a radially inward facing surface of the sidewall within the opening covers or encircles each of the slots, thus securing the cables within the slots.

In some examples, the cable management component has a bore defined by the ring portion. In such examples, the cable management component may have an outer surface and an inner surface, with the inner surface facing into the bore. The outer surface has protrusions (e.g., the teeth) and recesses (e.g., the slots) and thus does not form a perfectly circular cross-sectional shape. Thus the cable management component has different diameters at different portions thereof. Portions of outermost surfaces of the teeth may be flush with various hypothetical circles of different diameter, and these portions of the outermost surfaces may be referred to as an "outermost circumference" of the ring portion. For example, the outermost surfaces of the first portions of the teeth may be described collectively as a "first outermost circumference" of the ring portion, and whereas the outermost surfaces of the second portions of the teeth may be described collectively as a "second outermost circumference" of the ring portion. The bottom surfaces of the slots may be described collectively as the "circumference" of the ring portion, and the inner surface defined by the bore may be described as an "inner circumference" of the ring portion. It may be noted herein the bottom surfaces of the slots may correspond to the outer surface of the cable management component. Further, the opening formed in the sidewall may have a diameter which may be equal to a diameter of the second outermost circumference of the ring portion.

In some examples, the crosstalk regulator may include multiple cable management components, which may be fitted one inside the other, depending on a number of cables that needs to be routed between the controlled and external environments. For example, the crosstalk regulator may include a second cable management component slidably disposed in the bore and interlocked to the cable management component. In such examples, the second cable management component has a second ring portion surrounding the central axis and a plurality of second teeth protruding radially outward from the second ring portion. The second teeth define a plurality of second slots distributed around a second circumference of the second ring portion. Each of second slots is defined between a pair of adjacent second teeth of the plurality of second teeth and extends parallel to the central axis. Hence, each tooth may maintain a second space between adjacent second slots. Accordingly, each second slot which is spaced apart from the adjacent second slots by the pair of adjacent second teeth, may receive one second cable of a plurality of second cables such that the plurality of second slots route the plurality of second cables between the controlled and external environments while maintaining a second fixed distance between adjacent second cables of the plurality of second cables to regulate crosstalk among the plurality of second cables. Thus, the crosstalk regulator may maintain sufficient second fixed distance between adjacent second cables to regulate crosstalk among the second cables and create a stress free path for second cables to route between the controlled and external environments via the opening. In a similar manner as how the second portions of the teeth of the cable management component are received within the opening of the sidewall, the second teeth of the second ring portion may be received within the bore of the cable management component. The second teeth may engage with the inward facing surface of the ring portion, thus enclosing each of the second slots and securely retaining the cables disposed therein.

In some embodiments, the second cable management component also includes a bore, and an additional cable management component may be disposed therein similar to how the second cable management component is disposed in the bore of the cable management component. In some examples, even more cable management components may be further disposed within a bore of the additional cable management component in a nested fashion. Thus, the crosstalk regulator may include any number of cable management components nested together in this manner. The number of cable management components is limited only by size of the opening in the sidewall and the size and desired spacing between cables. The description below will focus on a case in which the crosstalk regulator includes two cable management components to aid understanding, but it should be understood that similar principles would apply to cases in which more than two cable management components are nested together in the crosstalk regulator.

The crosstalk regulator may further seal the controlled environment or isolate the controlled environment from the external environment. For example, the crosstalk regulator may include a sealing component, e.g., a plug which may be disposed in the bore of the innermost cable management component to prevent leakage of air between the controlled and external environments and/or prevent loss or gain of temperature between the controlled and external environments. In other examples, the innermost cable management component may have the sealing component integrally coupled thereto, i.e., the innermost cable management component does not have a bore and instead includes a sealed inner portion where the bore would otherwise have been.

Since the cables are adequately spaced apart from each other at the opening, the crosstalk may not occur between the cables when the data are transmitted through such cables. Hence, the cables may be able to transmit the data at high speeds without worrying about the data packet losses and/or transmission losses in the cables. Further, since the cables are held in an organized fashion and not bundled to route between the controlled and external environments, identifying one or more faulty cables from the plurality of cables, and replacing the identified one or more cables with one or more new cables may be relatively easier and less time consuming task. Since the crosstalk regulator provides a stress free path for cables to route between the two different environments through the opening (e.g., without tight bends/kinks or rubbing up against sharp edges of objects), the cables may be less likely to get spitted at the opening due to the sealing element.

Referring to the Figures, FIG. 1A depicts a perspective view of a cable management component 102 of a crosstalk regulator 100, FIG. 1B depicts a side view of the cable management component 102 of FIG. 1A, and FIG. 1C depicts a front view of the cable management component 102 of FIG. 1A. In the description hereinafter, FIGS. 1A-1C are described concurrently for ease of illustration.

The cable management component 102 has a ring portion 104 surrounding a central axis 10 of the crosstalk regulator 100. The central axis 10 may be referred to as a longitudinal axis, which extends along an axial direction of the crosstalk regulator 100. The cable management component 102 further has a bore 106 defined by the ring portion 104. In such examples, the cable management component 102 has an inner surface 108 and an outer surface 110. The inner surface 108 faces into the bore 106. As used herein, "inner surface" may be referred to as "inward facing surface" of the ring portion 104, which defines an inner circumference 116 of the ring portion 104. The cable management component 102 further has a plurality of teeth 112 protruding radially outwards from the ring portion 104. In other words, each tooth of the plurality of teeth 112 protrudes outwards along the radial direction relative to the central axis 10. The plurality of teeth 112 further defines a plurality of slots 114, which are distributed around a circumference 122 (or outer circumference) of the ring portion 104. The circumference 122 is defined along a bottom surface 142 of each slot 114 and which corresponds to the outer surface 110 of the cable management component 102. For example, each slot of the plurality of slots 114 is defined between a pair of adjacent teeth 113 of the plurality of teeth 112 and each slot of the plurality of slots 114 is recessed radially inwards from an outermost circumference 146 of the ring portion 104. The outermost circumference 146 is defined along outermost surfaces 145 of the teeth 112. Further, each slot of the plurality of slots 114 and each tooth of the plurality of teeth 112 extend in length parallel to the central axis 10 between a first end portion 118 and a second end portion 120 of the cable management component 102. In one or more examples, each tooth of the plurality of teeth 112 has a first portion 112A and a second portion 112B. The first portion 112A protrudes farther radially outward from the ring portion 104 than the second portion 112B. Further, the first portion 112A of each tooth in the plurality of teeth 112 is located at the first end portion 118 and the second portion 112B of each tooth in the plurality of teeth 112 is located between the second end portion 120 and the first portion 112A of the teeth 112. In some examples, the first portion 112A of each tooth of the plurality of teeth 112 has a first radial height "$H_1$" and the second portion 112B of each tooth of the plurality of teeth 112 has a second radial height "$H_2$", which is smaller than the first radial height "$H_1$". In other words, the first portion 112A has a delta height "$H_D$" more than that of the second radial height "$H_2$". In some examples, the first radial height "$H_1$" may be in a range from about 25 mm to about 35 mm and the second radial height "$H_2$" may be in a range from about 13 mm to about 20 mm. Further, the delta height "$H_D$" may be in a range from about 12 mm to 15 mm. In some examples, the first portion 112A of each tooth of the plurality of teeth 112 has a first axial length "$L_1$" and the second portion 112B of each tooth of the plurality of teeth 112 has a second axial length "$L_2$", which is greater than the first axial length "$L_1$". In some examples, the first axial length "$L_1$" may be in a range from about 13 mm to about 20 mm, and the second axial length "$L_2$" may be in a range from about 30 mm to about 40 mm. Further, each tooth of the plurality of teeth 112 has a tooth-width "$W_1$" defined along a circumferential dimension (or the circumference 122) of the ring portion 104. In some examples, the tooth-width "$W_1$" is in a range from about 13 mm to about 20 mm. Similarly, each slot of the plurality of slots 114 has a slot-width "$W_2$" defined along the circumferential dimension (or the circumference 122) of the ring portion 104. In some examples, the slot-width "$W_2$" is in a range from about 13 mm to about 20 mm.

In one or more examples, each tooth of the plurality of teeth 112 is an elongated tooth, which refers to a protrusion having a length "$LT_1$" that exceeds its width "$W_1$". As used herein, "length" refers to a dimension defined along the central axis 10 (or an axial direction) of the cable management component 102 and "width" refers to a circumferential dimension defined along the circumference 122 of the ring portion 104. Similarly, each slot of the plurality of slots 114 is an elongated slot, which refers to a recess having a length "$LS_1$" that exceeds its width "$W_2$".

As discussed herein, the outer surface 110 of the cable management component 102 has protrusions (e.g., the teeth 112) and recesses (e.g., the slots 114) and thus does not have a perfectly circular cross-sectional shape. Thus the cable management component 102 has different diameters at different portions thereof. Portions of outermost surface 145 of the teeth 112 may be flush with various hypothetical circles of different diameter, and these portions of the outermost surface 145 may be referred to as the outermost circumference 146 of the ring portion 104. For example, outermost surfaces 137 of the first portions 112A of the teeth 112 may be described collectively as a first outermost circumference 132, and outermost surfaces 123 of the second portions 112B of the teeth 112 may be described collectively as a second outermost circumference 124. The bottom surface 142 of each slot 114 (which corresponds to the outer surface 110 of the cable management component 102) may be described as the circumference 122 of the ring portion 104, and the inner surface 108 defined by the bore 106 may be described as the inner circumference 116 of the ring portion 104. In some examples, the ring portion 104 has a diameter "$D_1$" defined along the inner circumference 116 and a diameter "$D_2$" defined along the outermost circumference (e.g., the second outermost circumference 124) of the ring portion 104. In other words, the bore 106 of the cable management component 102 has the diameter "$D_1$" and the outermost surfaces 123 of the second portions 1126 of the teeth 112 has the diameter "$D_2$".

Figure 4:
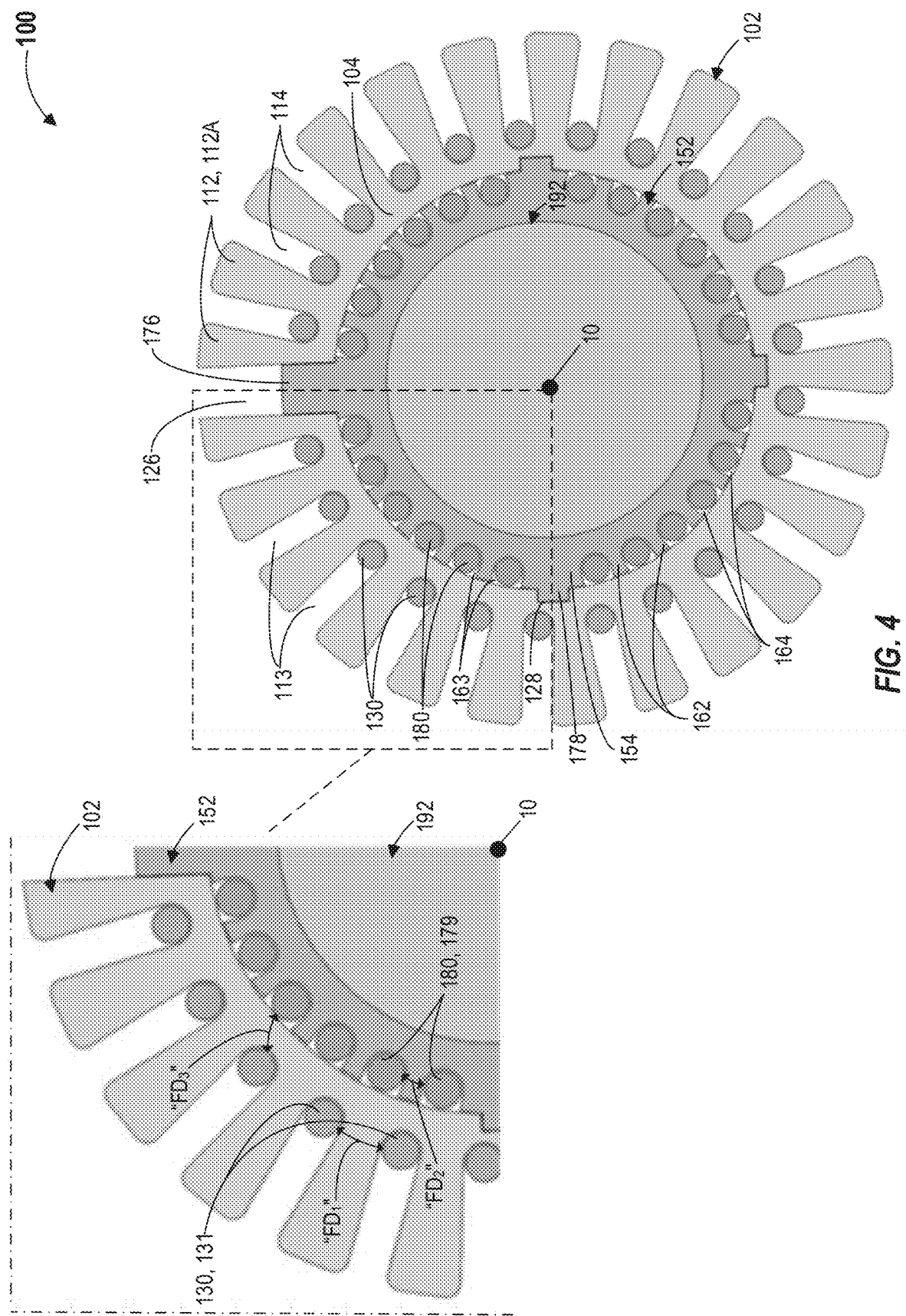
FIG. 4 illustrates a perspective view of a crosstalk regulator according to an example of the present disclosure.

In some examples, the cable management component 102 further includes an insertion slot 126 formed between the outermost circumference 146 (e.g., the first outermost circumference 132) and the inner circumference 116 of the ring portion 104. The insertion slot 126 extends in length parallel to the central axis 10 between the first end portion 118 and the second end portion 120 of the cable management component 102. In other words, the insertion slot 126 forms a break in the circumferential extent of the ring portion 104 such that the ring portion 104 does not fully enclose the central axis 10. Thus, in examples in which the insertion slot 126 is included, a cross-section of the ring portion 104 has the general shape of a ring but one which has a break or gap therein, i.e., an open or incomplete ring shape, as shown in FIG. 1C. The insertion slot 126 may facilitate the insertion of a plurality of second cables 180 (as shown in FIGS. 2C and 4) inside the bore 106 of the cable management component 102 from the first outermost circumference 132 of the ring portion 104. For example, the second cables 180 may be positioned outside of the cable management component 102 with a middle portion of the second cables 180 near the cable management component 102, and then the middle portions of the second cables 180 may be moved in a radial direction through the insertion slot 126 into the bore 106. This type of insertion facilitated by the insertion slot 126 is in contrast to a different type of insertion in which an end of the second cable 180 is inserted in an axial direction through bore 106. In some circumstances, the ability to insert the middle portion of the second cables 180 in the radial direction through the insertion slot 126 into the bore 106 may be desirable, as in some circumstances inserting the ends of the second cables 180 axially through the bore 106 may be difficult or not possible. For example, inserting the ends of the second cables 180 axially through the bore 106 may require unplugging the second cables 180 which may not be desired. As another example, the ends of the second cables 180 may include connectors that may be too large to fit through the bore 106 axially, particularly when there are many other cables already present in the bore 106.

Additionally, in some examples the cable management component 102 includes one or more grooves 128 disposed spaced apart from each other and formed in the inward facing surface of the ring portion 104 or the inner surface 108 of the cable management component 102. Each groove of the one or more grooves 128 is recessed radially inwards relative to the central axis 10 and extends from the first end portion 118 towards the second end portion 120 for a predefined first axial length. In the illustrated example, the cable management component 102 includes three grooves 128, e.g., a first groove 128A, a second groove 128B, and a third groove 128C. In such examples, the first groove 128A is disposed at about 90 degrees spaced apart from the insertion slot 126, the second groove 126B is disposed at about 90 degrees spaced apart from the first groove 126A, and the third groove 126C is disposed at about 90 degrees spaced apart from the second groove 126B and the insertion slot 126. In some examples, the plurality of grooves 128 may facilitate the interlocking of a second cable management component 152 (as shown in FIGS. 2A-2C) and/or a plug (such as the plug 192) with the cable management component 102.

Each slot of the plurality of slots 114 is configured to receive one cable of a plurality of cables 130 (also referred to as a plurality of first cables), while maintaining a fixed distance "$FD_1$" between adjacent cables 131 of the plurality of cables 130 to regulate crosstalk among the plurality of cables 130. In some examples, at least some cables of the plurality of cables 130 may be a data cables, e.g., category 6 (CAT6) cables or the like. In some examples, the cable management component 102 may be slidably disposed in a cabinet 200 (as shown in FIG. 4) to route the plurality of cables between a controlled environment 208 of the cabinet 200 and an external environment 210. For example, the crosstalk regulator 100 disposed in the cabinet 200 may permit each slot of the plurality of slots 114 to receive only one cable of the plurality of cables 130 such that the plurality of slots 114 route the plurality of cables 130 between the controlled environment 208 and the external environment 210 while maintaining the fixed distance "$FD_1$" between adjacent cables 131 of the plurality of cables 130 to regulate crosstalk among the plurality of cables 130.

In some examples, the crosstalk regulator 100 may further include a plug 192 configured to be disposed in the bore 106 and fastened to the cable management component 102 to prevent leakage of a fluid between the controlled environment 208 and the external environment 210. In other examples, the crosstalk regulator 100 may include one or more additional cable management components nested within the bore 106, such as a second cable management component 152 (as shown in FIG. 2A) described in greater detail below. In still other examples, the cable management component 102 does not have the bore 106, and instead the cable management component 102 may include a central portion (not illustrated) that is integrally coupled to the ring portion 104 and occupies the space where the bore 106 would otherwise have been located.

Referring to the Figures, FIG. 2A depicts a perspective view of a second cable management component 152 of a crosstalk regulator 100, FIG. 2B depicts a side view of the second cable management component 152 of FIG. 2A, and FIG. 2C depicts a front view of the second cable management component 152 of FIG. 2A. In the description hereinafter, FIGS. 2A-2C are described concurrently for ease of illustration.

The second cable management component 152 has a second ring portion 154 surrounding a central axis 10 of the crosstalk regulator 100. The second cable management component 152 further has a second bore 156 defined by the second ring portion 154. In such examples, the second cable management component 152 has a second inner surface 158 and a second outer surface 160. The second inner surface 158 faces into the second bore 156. As used herein, "second inner surface" may be referred to as "inward facing surface" of the second ring portion 154, which defines a second inner circumference 166 of the second ring portion 154. The second cable management component 152 further has a plurality of second teeth 162 protruding radially outwards from the second ring portion 154. In other words, each second tooth of the plurality of second teeth 162 protrudes outwards along the radial direction relative to the central axis 10. The plurality of second teeth 162 further defines a plurality of second slots 164, which are distributed around a second circumference 172 (or second outer circumference) of the second ring portion 154. The second circumference 172 is defined along a bottom surface 190 of each second slot 164 and which corresponds to the second outer surface 160 of the second cable management component 152. For example, each second slot of the plurality of second slots 164 is defined between a pair of second adjacent teeth 163 of the plurality of second teeth 162 and each second slot of the plurality of second slots 164 is recessed radially inwards from an outermost circumference 182 (e.g., a third outermost circumference 184) of the second ring portion 154. The third outermost circumference 184 is defined along outermost surfaces 183 of the second teeth 162. Further, each second slot of the plurality of second slots 164 and each second tooth of the plurality of second teeth 162 extend in length parallel to the central axis 10 between a first end portion 168 and a second end portion 170 of the second cable management component 152. Each second tooth of the plurality of second teeth 162 has a tooth-width "$W_3$" along a circumferential dimension (or the second circumference 172) of the second ring portion 154. In some examples, the tooth-width "$W_3$" is in a range from about 13 mm to about 20 mm. Similarly, each second slot of the plurality of second slots 164 has a slot-width "$W_4$" along the circumferential dimension of the second ring portion 154. In some examples, the slot-width "$W_4$" is in a range from about 13 mm to about 20 mm. In some examples, the fixed distance "$FD_1$" is in a range from about 13 mm to about 25 mm and the second fixed distance "$FD_2$" is in a range from about 13 mm to about 25 mm.

In one or more examples, each second tooth of the plurality of second teeth 162 is an elongated tooth, which refers to a protrusion having a length "$LT_2$" that exceeds its width "$W_3$". As used herein, "length" refers to a dimension defined along the central axis 10 (or an axial direction) of the second cable management component 152 and "width" refers to a circumferential dimension defined along the second circumference 172 of the second ring portion 154. Similarly, each second slot of the plurality of second slots 164 is an elongated slot, which refers to a recess having a length "$LS_2$" that exceeds its width "$W_4$".

Figure 5:
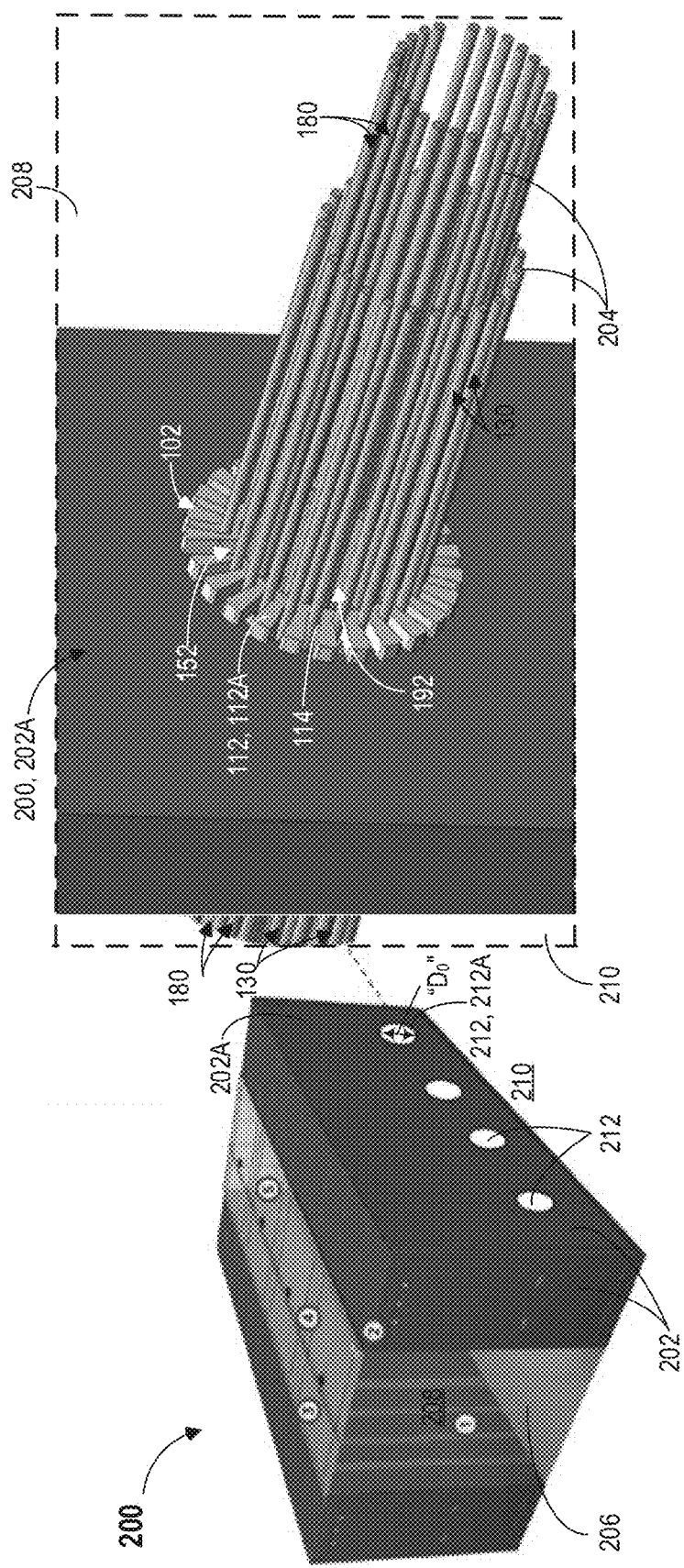
FIG. 5 illustrates a schematic diagram of a structure (e.g., cabinet) having the crosstalk regulator of FIG. 4 according to an example of the present disclosure.

In some embodiments, the second cable management component 152 further includes an insertion protrusion 176 formed on an outward facing surface of one of the second teeth 162 of the second cable management component 152. For example, the insertion protrusion 176 protrudes radially outwards from the outermost surface 183 of one of the second teeth 162 of the second cable management component 152. The insertion protrusion 176 extends parallel to the central axis 10 between the first end portion 168 and the second end portion 170 of the second cable management component 152. The insertion protrusion 176 may be configured to be received within the insertion slot 126 when the second cable management component 152 is slidably inserted inside the bore 106 of the cable management component 102. Friction between the insertion protrusion 176 and the cable management component 102 may help to secure the second cable management component 152 to the cable management component 102. In addition, the insertion protrusion 176 may contact the portions of the cable management component 102 that face into the insertion slot 126 and this contact may help resist deformation of the cable management component 102 that might otherwise occur due to the insertion slot 126. This contact may also help to press the cable management component firmly against the rim of the opening 212 (as shown in FIG. 5) to aid in securely holding the crosstalk regulator 100 in the opening 212.

Additionally, the second cable management component 152 includes one or more ridges 178 disposed spaced apart from each other and formed on the outward facing surface of one or more second teeth 162 of the second cable management component 152. For example, the one or more ridges 178 protrudes radially outward from the outermost surfaces 183 of the one or more second teeth 162 of the second cable management component 152. Each of the ridges 178 protrudes radially outwards relative to the central axis 10 and extends from the first end portion 168 towards the second end portion 170 for a predefined second axial length, which may be equal to the predefined first axial length of the grooves 128 (as shown in FIGS. 1A-1C). The ridges 178 are complimentary in size and shape to the grooves 128 and are located such that the ridges 178 and grooves 128 can engage with one another when the second cable management component 152 is inserted in the bore 106. In the illustrated example, the cable management component 102 includes three ridges 178, e.g., a first ridge 178A, a second ridge 178B, and a third ridge 178C. In such examples, the first ridge 178A is disposed at about 90 degrees spaced apart from the insertion protrusion 176, the second ridge 176B is disposed at about 90 degrees spaced apart from the first ridge 176A, and the third ridge 176C is disposed at about 90 degrees spaced apart from the second ridge 1766 and the insertion protrusion 176. In some examples, the engagement of the ridges 178 with the grooves 128 may facilitate the interlocking of the second cable management component 152 with the cable management component 102.

As discussed herein, the second outer surface 160 of the second cable management component 152 has protrusions (e.g., the second teeth 162, the insertion protrusion 176, and the one or more ridges 178) and recesses (e.g., the second slots 164) and thus does not form a perfectly circular cross-sectional shape. Thus, the second cable management component 152 has different diameters at different portions thereof. Portions of outermost surfaces 181 belonging to the second teeth 162, the insertion protrusion 176, and the one or more ridges 178 may be flush with various hypothetical circles of different diameter, and these portions of the outermost surfaces 181 may be referred to as the outermost circumference 182 of the second ring portion 154. For example, outermost surface 187 of the insertion protrusion 176 may be described as a first outermost circumference 188 of the second ring portion 154, outermost surfaces 185 of the one or more ridges 178 may be described collectively as a second outermost circumference 186 of the second ring portion 154, and the outermost surfaces 183 of the second teeth 162 may be described collectively as the third outermost circumference 184 of the second ring portion 154. The bottom surface 161 of each second slot 164 (which corresponds to the second outer surface 160 of the second cable management component 152) may be described as the second circumference 172 of the second ring portion 154, and the second inner surface 158 defined by the second bore 156 may be described as the second inner circumference 166 of the second ring portion 154. In some examples, the second ring portion 154 has a diameter "$D_3$" defined along the outermost circumference 182 (e.g., the third outermost circumference 184) of the second ring portion 154, which is equal to the diameter "$D_1$" of the bore 106 of the cable management component 102 and the second bore 156 of the second cable management component 152 has a diameter "$D_4$". In other words, the outermost surfaces 183 of the second teeth 162 has the diameter "$D_3$" and the second bore 156 of the second cable management component 152 has the diameter "$D_4$".

Each second slot of the plurality of second slots 164 is configured to receive one second cable of a plurality of second cables 180 while maintaining a second fixed distance "$FD_2$" between adjacent second cables 179 of the plurality of second cables 180 to regulate crosstalk among the plurality of second cables 180. In some examples, at least some second cables of the plurality of second cables 180 may be data cables, e.g., CAT5 cables or the like. In some examples, the second cable management component 152 may be slidably disposed in the bore 106 of the cable management component 102 and interlocked with the cable management component 102, e.g., by slidably disposing the plurality of ridges 178 of the second cable management component 152 into the plurality of grooves 128 of the cable management component 102. In one or more examples, the crosstalk regulator 100 disposed in the cabinet 200 may permit each second slot of the plurality of second slots 164 to receive only one second cable of the plurality of second cables 180 such that the plurality of second slots 164 route the plurality of second cables 180 between the controlled environment 208 and the external environment 210 while maintaining the second fixed distance "$FD_2$" between adjacent second cables 131 of the plurality of cables 130 to regulate crosstalk among the plurality of cables 130. In such examples, the crosstalk regulator 100 may further include a plug 192 disposed in the second bore 156 and fastened to the second cable management component 152 to prevent leakage of the fluid between the controlled environment 208 and the external environment 210.

Figure 3A:
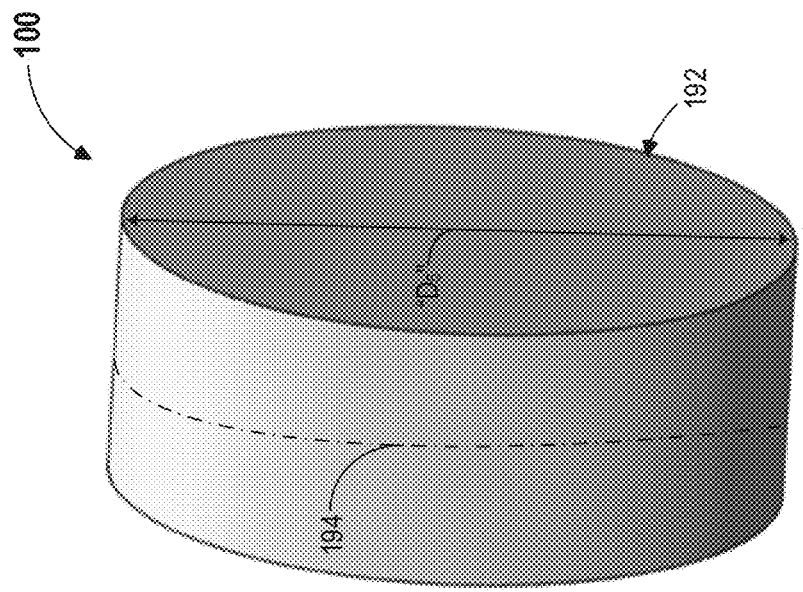
FIG. 3 illustrates a perspective view of a plug of a crosstalk regulator according to an example of the present disclosure.

FIG. 3 depicts a perspective view of a plug 192 of a crosstalk regulator 100. In one or more examples, the plug 192 is a circular component having a circumference 194. In some examples, plug 192 may be made of a flexible material such as foam, rubber, silicon, plastic, cork, or the like. In some other examples, the plug 192 may be made of a rigid material such as metal, or the like. In some other examples, the plug 192 may be a combination of the flexible material and the rigid material such as a compliant ring having a gasket disposed around the circumference 194 of the compliant ring.

In some examples in which the crosstalk regulator 100 includes just one cable management component, i.e., the cable management component 102, the plug 192 may be configured to be inserted into the bore 106. In such examples, the plug 192 may have a diameter "$D_5$", which may be equal to the diameter "$D_1$" of the ring portion 104 (as shown in FIGS. 1A-1C), thus allowing the plug 192 to be disposed in and substantially close (i.e., block, fill, or seal) the bore 106. In some examples, the plug 192 may be fastened to the cable management component 102 while in the bore 106 using chemical or mechanical fasteners (e.g., screws, glue, etc.) or other fastening techniques (e.g., heat joining, etc.), to prevent leakage of a fluid between the controlled environment and the external environment. In some examples, the fasteners may be glue. In other examples, contact between the plug 192 and the cable management component 102 may be sufficient to create a seal to prevent leakage. In particular, in some examples, the plug 192 is made from a compliant material and the diameter "$D_5$" of the plug may be slightly larger than diameter "$D_1$" for at least a portion of the plug 192, and this may enable that portion of the plug 192 to be compressed upon insertion of the plug 192 into the bore 106, creating contact pressure which both secures the plug 192 in the bore 106 and seals the bore 106.

In some examples in which the crosstalk regulator 100 includes more than one cable management component, the plug 192 may be configured to be inserted into a bore of the inner-most cable management component. In particular, in examples in which the crosstalk regulator 100 includes the cable management component 102 and the second cable management component 152 inserted into the bore 106, the plug 192 may be configured to be inserted into the second bore 156 of the second cable management component 152. In these examples, the diameter "$D_5$" may be equal to the diameter "$D_4$" of the second ring portion 154 (as shown in FIGS. 2A-2C), thus allowing the plug 192 to be disposed in and substantially close (i.e., block, fill, or seal) the second bore 156. In some examples, the plug 192 may be fastened to the second cable management component 152 using fasteners or the like, to prevent leakage of the fluid between the controlled environment and the external environment. In other examples, the plug 192 may use deformation and friction to fasten the plug 192 to the second cable management component 152 and to seal the second bore 156, as described above.

FIG. 4 depicts a perspective view of one example of a crosstalk regulator 100 in an assembled state and FIG. 5 illustrates the crosstalk regulator 100 in an installed state in a cabinet 200. The crosstalk regulator 100 includes a cable management component 102, a second cable management component 152, and a plug 192. In the illustrated assembled state, the second cable management component 152 is inserted into the bore 106 of the cable management component 102 and the plug 192 is inserted into the second bore 156 of the second cable management component 152 (the bore 106 and the second bore 156 are not visible in FIG. 4 due to being filled by the second cable management component 152 and/or the plug 192).

In one or more examples, the cable management component 102 is configured to be slidably disposed in an opening 212A formed on a sidewall 202A of a structure (e.g., cabinet 200, see FIG. 5) such that at least part of the second portion 112B of each tooth in the plurality of teeth 112 is disposed in the opening 212A and the first portion 112A of each tooth is engaged to the sidewall 202A to releasably retain the crosstalk regulator 100 in the cabinet 200. The second cable management component 152 is slidably disposed in the bore 106 such that the insertion protrusion 176 of the second cable management component 152 is disposed inside the insertion slot 126 of the cable management component 102. Further, the second cable management component 152 is interlocked to the cable management component 102. For example, each ridge of the plurality of ridges 178 of the second cable management component 152 is engaged with a corresponding groove of the plurality of grooves 128 of the cable management component 102 to interlock the second cable management component 152 to the cable management component 102.

In some examples, each slot of the plurality of slots 114 is configured to receive one cable of a plurality of cables 130 (see FIGS. 4 and 5) such that the plurality of slots 114 route the plurality of cables 130 between a controlled environment 208 of the cabinet 200 and an external environment 210 while maintaining a fixed distance "$FD_1$" between adjacent cables 131 of the plurality of cables 130 to regulate crosstalk among the plurality of cables 130. Similarly, each second slot of the plurality of second slots 164 is configured to receive one second cable of a plurality of second cables 180 (see FIGS. 4 and 5) such that the plurality of second slots 164 route the plurality of second cables 180 between the controlled environment 208 and the external environment 210 while maintaining a second fixed distance "$FD_2$" between adjacent second cables 179 of the plurality of second cables 180 to regulate crosstalk among the plurality of second cables 180. Further, each cable of the plurality of cables 130 is disposed spaced apart from an adjacent second cable of the plurality of second cables 180 by a third fixed distance "$FD_3$" to regulate the crosstalk between the plurality of second cables 180 and the plurality of cables 130. In some examples, the third fixed distance "$FD_3$" is in a range from about 13 mm to about 20 mm.

In some examples, one or more slots of the plurality of slots 114 may be empty i.e., the one or more slots 114 may not route the cable 130 and one or more second slots of the plurality of second slots 164 may be empty i.e., the one or more second slots 164 may not route the second cable 180. In such examples, the one or more slots 114 and the one or more second slots 164 may be covered with a plug (not illustrated), to prevent leakage of air from the controlled environment 208 to the external environment 210 or transfer of heat between the controlled environment 208 and the external environment 210.

FIG. 5 depicts a schematic diagram of a structure (e.g., cabinet 200) having the crosstalk regulator 100 of FIG. 4. In some examples, the cabinet 200 may be configured to be deployed in a datacenter or other facilities. In some examples, the cabinet 200 deployed in the datacenter, may be an aisle containment system, a rack, or the like. The cabinet 200 includes a plurality of sidewalls 202, cables 204, and the crosstalk regulator 100.

The plurality of sidewalls 202 may be disposed spaced apart and coupled to each other to define an enclosure 206 therebetween. The cabinet 200 may include a plurality of electronic devices (not shown) such as a computer (server device, storage device), a networking device (switches), or the like deployed within the enclosure 206 for executing one or more workloads of customers. In such examples, one or more parameters such as temperature, air flow of the enclosure 206 may be regulated so as to provide suitable operating conditions for the electronic devices to execute the one or more workloads. Accordingly, the cabinet 200 has a controlled environment 208 inside the enclosure 206. However, an environment outside of the cabinet 200 may be referred to as external environment 210, which is unregulated. In some examples, the external environment 210 may be one of a hot environment, a cold environment, or the like. In some examples, a sidewall 202A among the plurality of sidewalls 202 may include a plurality of openings 212. In such examples, each opening among the plurality of openings 212 may allow the plurality of cables 204 to be routed between the controlled environment 208 and the external environment 210. Accordingly, the crosstalk regulator 100 slidably deployed in a corresponding opening among the plurality of openings 212 manages routing of cables 204 therebetween the controlled environment 208 and the external environment 210 and prevent the crosstalk therebetween the cables 204.

In the illustrated example, an opening 212A among the plurality of openings 212 includes the crosstalk regulator 100. The opening 212A is enlarged for illustrating the crosstalk regulator 100 and the cables 204 routing between the external environment 210 and the controlled environment 208. In such examples, remaining openings of the plurality of openings 212 may be covered with a plug such as the plug 192 discussed in the example of FIG. 3 to prevent leakage of air from the controlled environment 208 to the external environment 210 or transfer of heat between the controlled environment 208 and the external environment 210. In some examples, the opening 210A formed in the sidewall 202A may have a diameter "Do" which may be equal to the diameter "$D_2$" of the second outermost circumference 124 of the ring portion 104.

At least some cables of the cables 204 may be a data cable. In some examples, the data cable may be CAT5, CAT6, local area network (LAN) cables, or the like without deviating from the scope of the present disclosure. The cables 204 may include a plurality of cables 130 (as discussed in the example of FIG. 1C) and a plurality of second cables 180 (as discussed in the example of FIG. 2C).

As discussed in the example of FIG. 4, the crosstalk regulator 100 includes a cable management component 102, a second cable management component 152, and a plug 192. The second cable management component 152 is slidably disposed in the bore 106 (as shown in FIGS. 1A-1C) of the cable management component 102 and interlocked to the cable management component 102. For example, the insertion protrusion 176 of the second cable management component 152 is slidably disposed in the insertion slot 126 of the cable management component 102 to dispose the second cable management component 152 in the cable management component 102. Further, the plurality of ridges 178 of the second cable management component 152 is engaged with the plurality of grooves 128 of the cable management component 102 to interlock the second cable management component 152 to the cable management component 102. Further, the plug 192 may be slidably disposed in the second bore 156 of the second cable management component 152 and fastened to the second cable management component to prevent leakage of a fluid (air) between the controlled environment 208 and the external environment 210.

In one or more examples, each slot of the plurality of slots 114 (as shown in FIG. 4) receives one cable of a plurality of cables 130 such that the plurality of slots 114 route the plurality of cables 130 between an environment (e.g., the controlled environment 208) on one side of the sidewall 202A and another environment (e.g., the external environment 210) on an opposite side of the sidewall 202A while maintaining a fixed distance "FD$_1$" (as shown in FIG. 4) between adjacent cables of the plurality of cables 130 to regulate crosstalk among the plurality of cables 130. Similarly, each second slot of the plurality of second slots 164 (as shown in FIG. 4) receives one second cable of a plurality of second cables 180 such that the plurality of second slots 164 route the plurality of second cables 180 between the controlled environment 208 and the external environment 210 while maintaining a second fixed distance "FD$_2$" (as shown in FIG. 4) between adjacent second cables of the plurality of second cables 180 to regulate crosstalk among the plurality of second cables 180. Additionally, each cable of the plurality of cables 130 is disposed spaced apart from an adjacent second cable of the plurality of second cables 180 by a third fixed distance "FD$_3$" (as shown in FIG. 4) to regulate the crosstalk between the plurality of second cables 180 and the plurality of cables 130.

The crosstalk regulator 100 is slidably disposed in the opening 212A formed in the sidewall 202A of the cabinet 200. In particular, the cable management component 102 is disposed in the opening 212A such that at least part of the second portion 112B (as shown in FIGS. 1A-1C) of each tooth in the plurality of teeth 112 of the cable management component 102 is disposed in the opening 212A and the first portion 112A of each tooth in the plurality of teeth 112 of the cable management component 102 is engaged to the sidewall 202A to releasably retain the crosstalk regulator 100 in the cabinet 200.

In some examples, the cable management component 102 may further include a plurality of through-holes (not shown) formed in at least some of the first portion 112A of the plurality of teeth 112 and a plurality of fasteners (not shown) such as screws. Each through-hole may extend parallel to the central axis 10. In such examples, each fastener may be inserted into a corresponding through-hole of the plurality of through-holes and fastened to the sidewall 202A to further secure the crosstalk regulator 100 to the cabinet 200.

Since the cables 204 are adequately spaced apart from each other at the opening 212A, the crosstalk may not occur between the cables 204 when the data are transmitted through the cables 204. Hence, the cables 204 may be able to transmit the data at high speeds without worrying about the data packet losses and/or transmission losses in the cables 204. Further, since the cables 204 are held in an organized fashion and not bundled to route between the controlled environment 208 and the external environment 210, identifying one or more faulty cables from the cables 204, and replacing the identified one or more cables with one or more new cables may be relatively easier and less time consuming task. Since the crosstalk regulator provides a stress free path for cables 204 to route between the two different environments (e.g., without tight bends/kinks or rubbing up against sharp edges of objects), through the opening 212A, the cables 204 may be less likely to get spitted at the opening 212A due to the plug 192.

FIGS. 6A-6G depicts a plurality of steps for routing a plurality of cables 130 and a plurality of second cables 180 between a controlled environment 208 of a cabinet 200 and an external environment 210 via a crosstalk regulator 100 deployed in the cabinet 200. It may be noted herein that the plurality of steps as depicted in FIGS. 6A-6G are described in conjunction with FIGS. 4-5, for example.

Figure 6A:
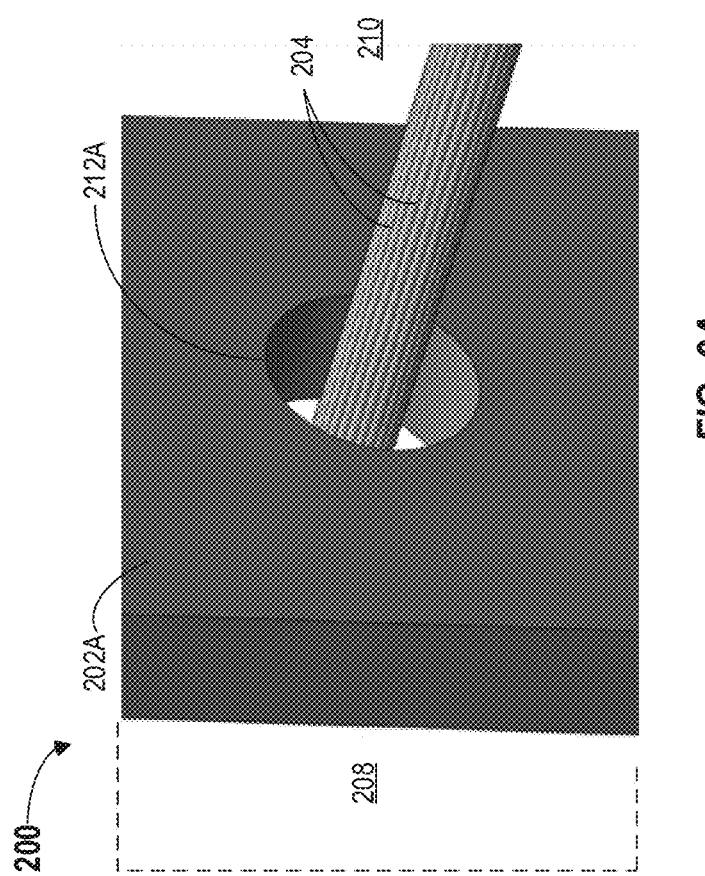
FIG. 6A-6G illustrates a plurality of steps for routing a plurality of first cables and a plurality of second cables between a controlled environment of a cabinet and an external environment via a crosstalk regulator deployed in the cabinet according to an example of the present disclosure.

Referring to FIG. 6A, the cabinet 200 has a controlled environment 208 inside the enclosure 206 (as shown in FIG. 5) and a sidewall 202A. The sidewall 202A has an opening 212A. In such examples, the cabinet 200 further includes cables 204 having a plurality of cables 130 and a plurality of second cables 180 (as labeled in FIG. 6B). The cables 204 are routed between the controlled environment 208 and an external environment 210 via the opening 212A.

Figure 6B:
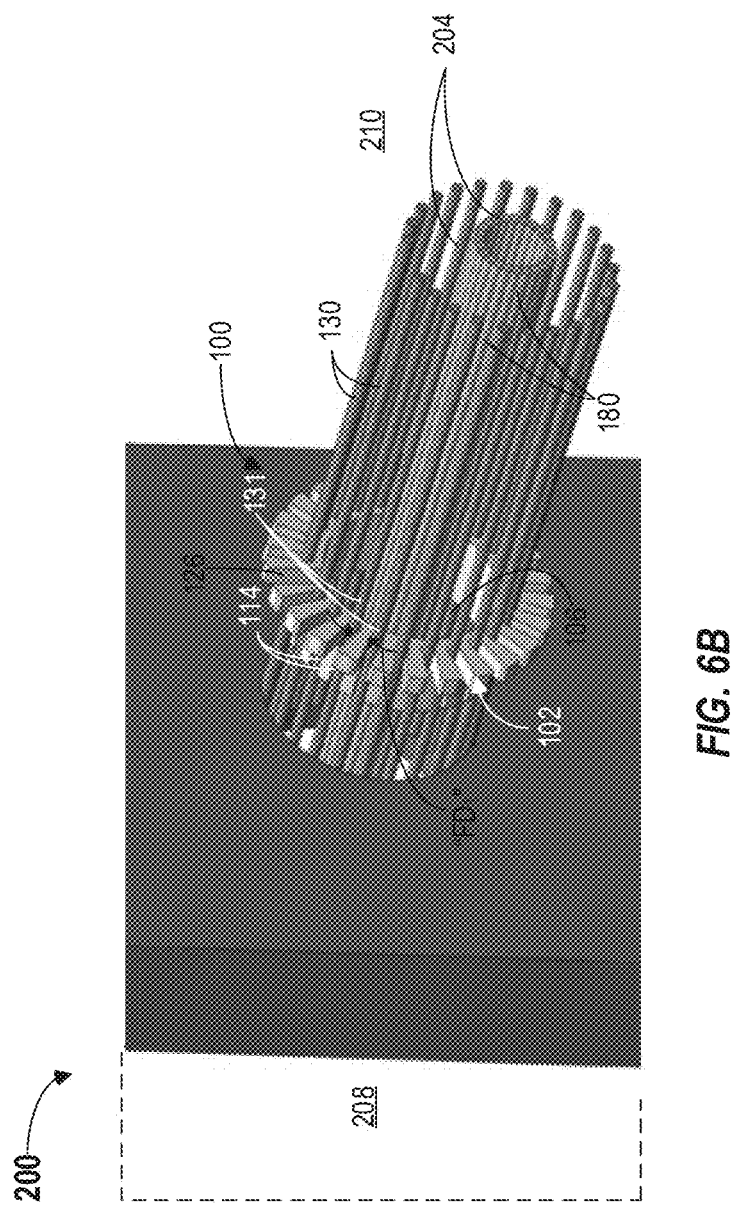

Referring to FIG. 6B, the cables 204 that are routed between the controlled environment 208 and the external environment 210 are disposed on a cable management component 102 of the crosstalk regulator 100. For example, each of the plurality of cables 130 among the cables 204 is inserted into respectively corresponding slots of a plurality of slots 114 of the cable management component 102. In other words, one cable of the plurality of cables 130 is inserted into a corresponding slot of the plurality of slots 114. Thus, the plurality of slots 114 routes the plurality of cables 130 between the controlled environment 208 and the external environment 210 while maintaining a fixed distance "FD$_1$" (as shown in FIG. 4) between adjacent cables 131 of the plurality of cables 130 to regulate crosstalk among the plurality of cables 130. Further, the plurality of second cables 180 among the cables 204 is inserted inside the bore 106 via the insertion slot 126 in the cable management component 102. As discussed in the examples of FIGS. 4-5, the cable management component 102 includes a ring portion 104 (as labeled in FIGS. 4-5) surrounding a central axis 10 (as labeled in FIGS. 4-5) and a plurality of teeth 112 protruding radially outward from the ring portion 104. The teeth 112 define the plurality of slots 114 distributed around a circumference 122 (as labeled in FIG. 1C) of the ring portion 104. Each of slots 114 is defined between a pair of adjacent teeth 113 (as labeled in FIG. 1C) of the plurality of teeth 112 and extends parallel to the central axis 10. Further, each of the teeth 112 includes a first portion 112A and a second portion 112B (as labeled in FIG. 1A). The first portion 112A protrudes farther radially outward from the ring portion 104 than the second portion 112B.

Figure 6C:
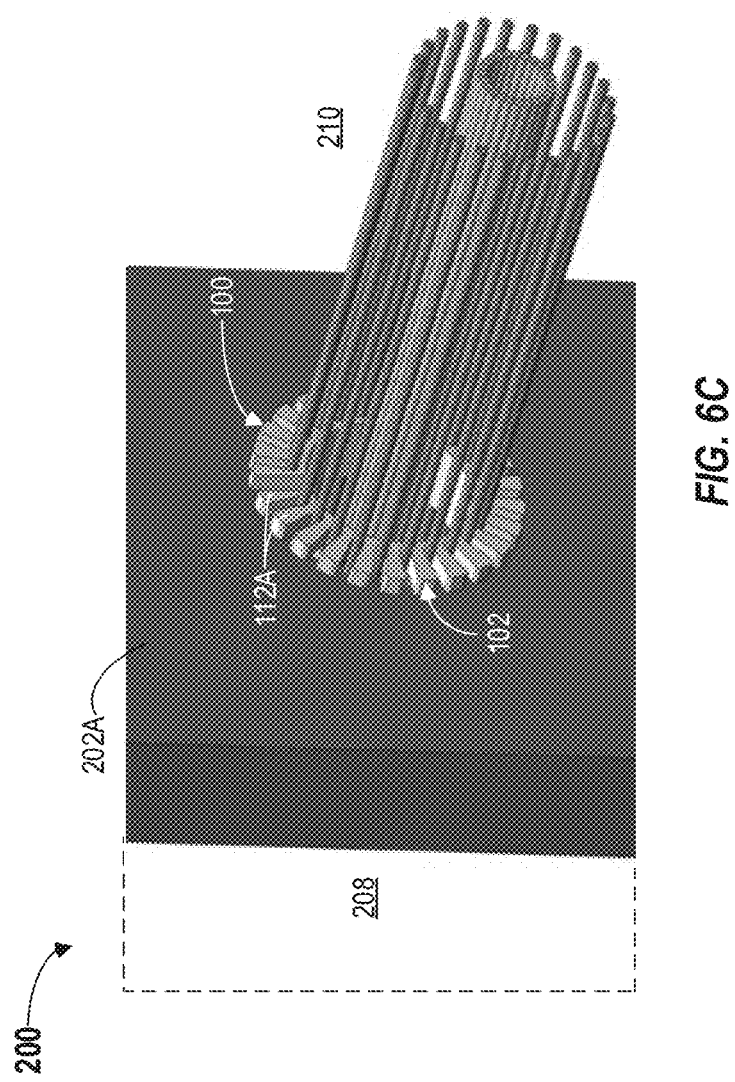

Referring to FIG. 6C, the cable management component 102 is slidably disposed into the opening 212A (as labeled in FIG. 6A) of the sidewall 202A. In such examples, at least part of the second portion 112B of each tooth in the plurality of teeth 112 is disposed in the opening 212A and the first portion 112A of each tooth in the plurality of teeth 112 is engaged to the sidewall 202A to releasably retain the crosstalk regulator 100 in the cabinet 200. As discussed herein, a plurality of fasteners (not shown) may be used to secure the crosstalk regulator 100 to the sidewall 202A of the cabinet 200.

Figure 6D:
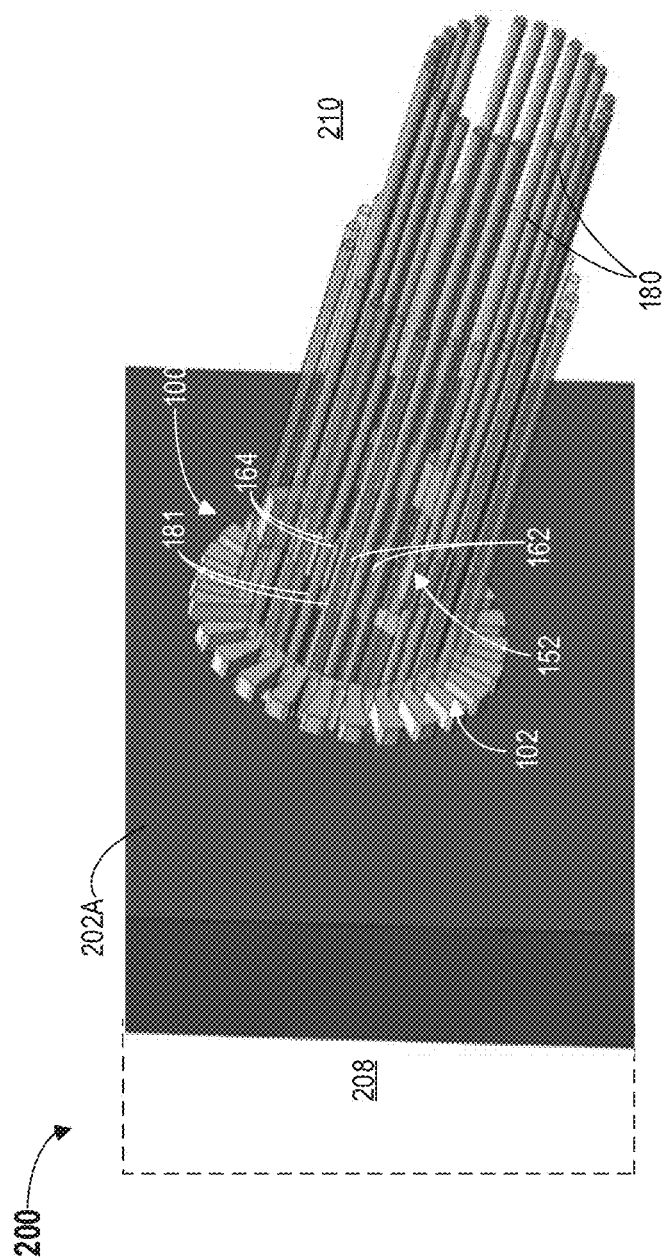

Referring to FIG. 6D, each second cable of the plurality of second cables 180 disposed in the bore 106 of the cable management component 102 is inserted into respectively corresponding second slots of a plurality of second slots 164 of the second cable management component 152. In other words, one second cable of the plurality of second cables 180 is inserted into a corresponding slot of the plurality of second slots 164. Thus, the plurality of second slots 164 routes the plurality of second cables 180 between the controlled environment 208 and the external environment 210 while maintaining a second fixed distance "FD$_2$" (as shown in FIG. 4) between adjacent second cables 179 of the plurality of second cables 180 to regulate crosstalk among the plurality of second cables 180. As discussed in the examples of FIGS. 4-5, the second cable management component 152 includes a second ring portion 154 (as labeled in FIGS. 4-5) surrounding the central axis 10 and a plurality of second teeth 162 protruding radially outward from the second ring portion 154. The second teeth 162 defines the plurality of second slots 164 distributed around a second circumference 172 (as labeled in FIG. 2C) of the second ring portion 154. Each of second slots 164 is defined between a pair of second adjacent teeth 163 (as labeled in FIG. 2C) of the plurality of second teeth 162 and extends parallel to the central axis 10.

Figure 6E:
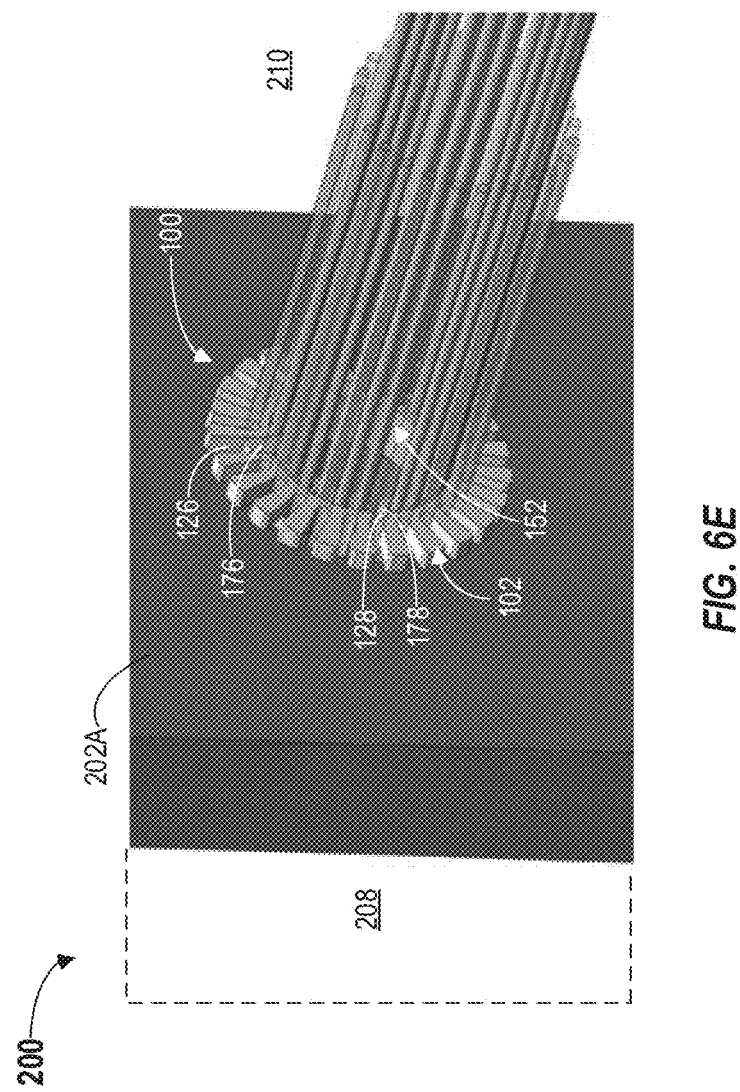

Referring to FIG. 6E, the second cable management component 152 is slidably disposed into the bore 106 (as labeled in FIG. 6A) of the cable management component 102. For example, the insertion protrusion 176 of the second cable management component 152 is slidably disposed in the insertion slot 126 of the cable management component 102 to dispose the second cable management component 152 in the cable management component 102. Further, the plurality of ridges 178 of the second cable management component 152 is engaged with the plurality of grooves 128 of the cable management component 102 to interlock the second cable management component 152 to the cable management component 102.

Figure 6F:
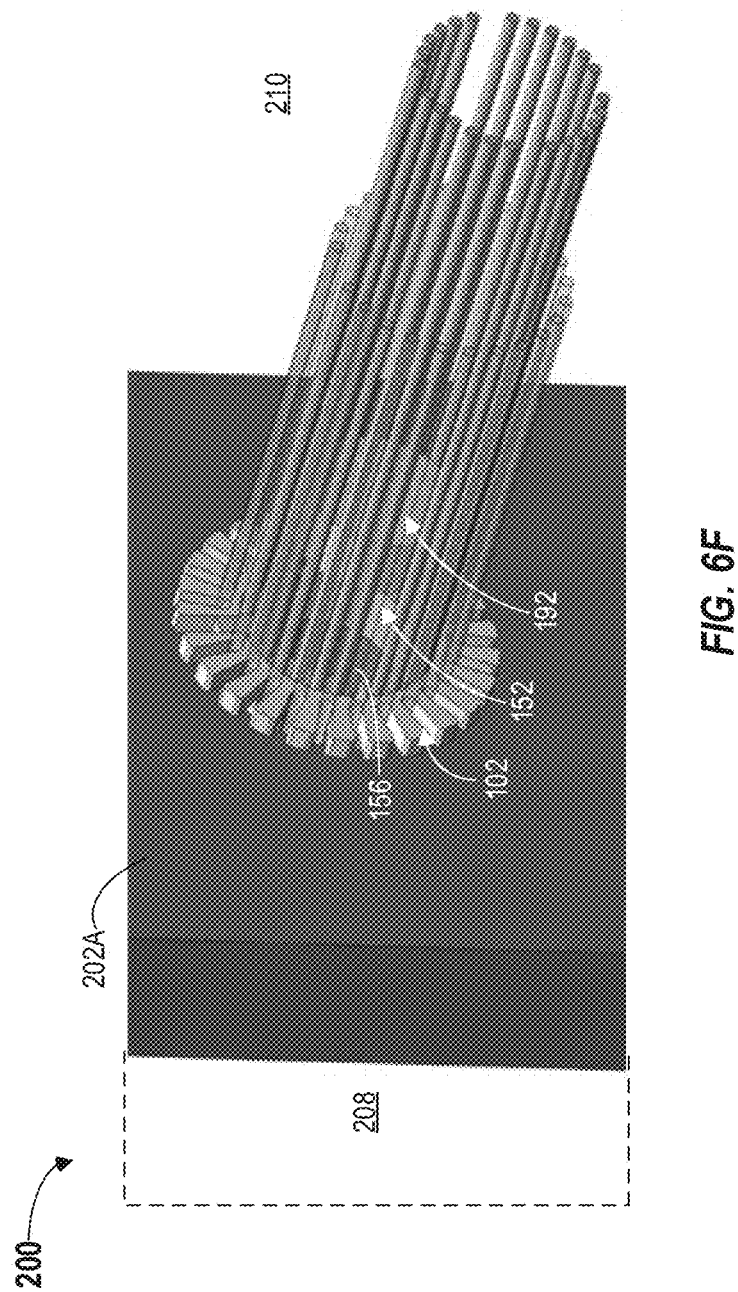
Figure 6G:
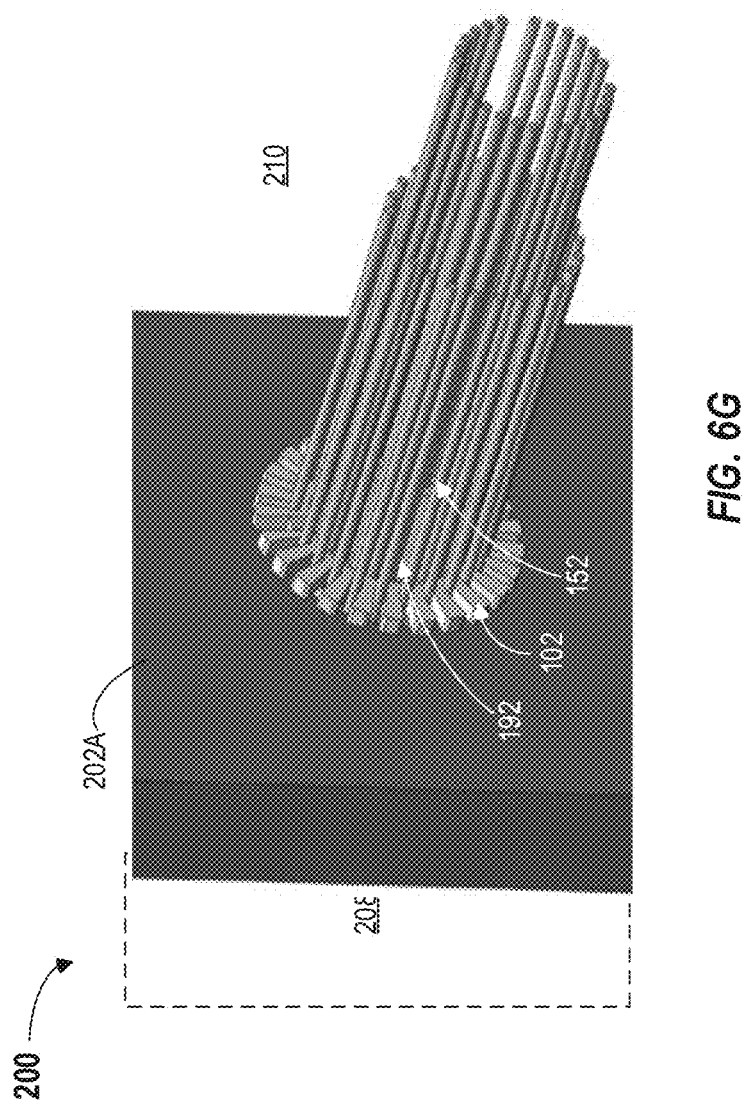

Referring to FIGS. 6F-6G, a plug 192 is positioned between the plurality of cables 130 and the plurality of second cables 180 and inserted inside the crosstalk regulator 100. For example, the plug is disposed in a second bore 156 of the second cable management component 152 and fastened to the second cable management component 152 to prevent leakage of a fluid (air) between the controlled environment 208 and the external environment 210.

Figure 7:
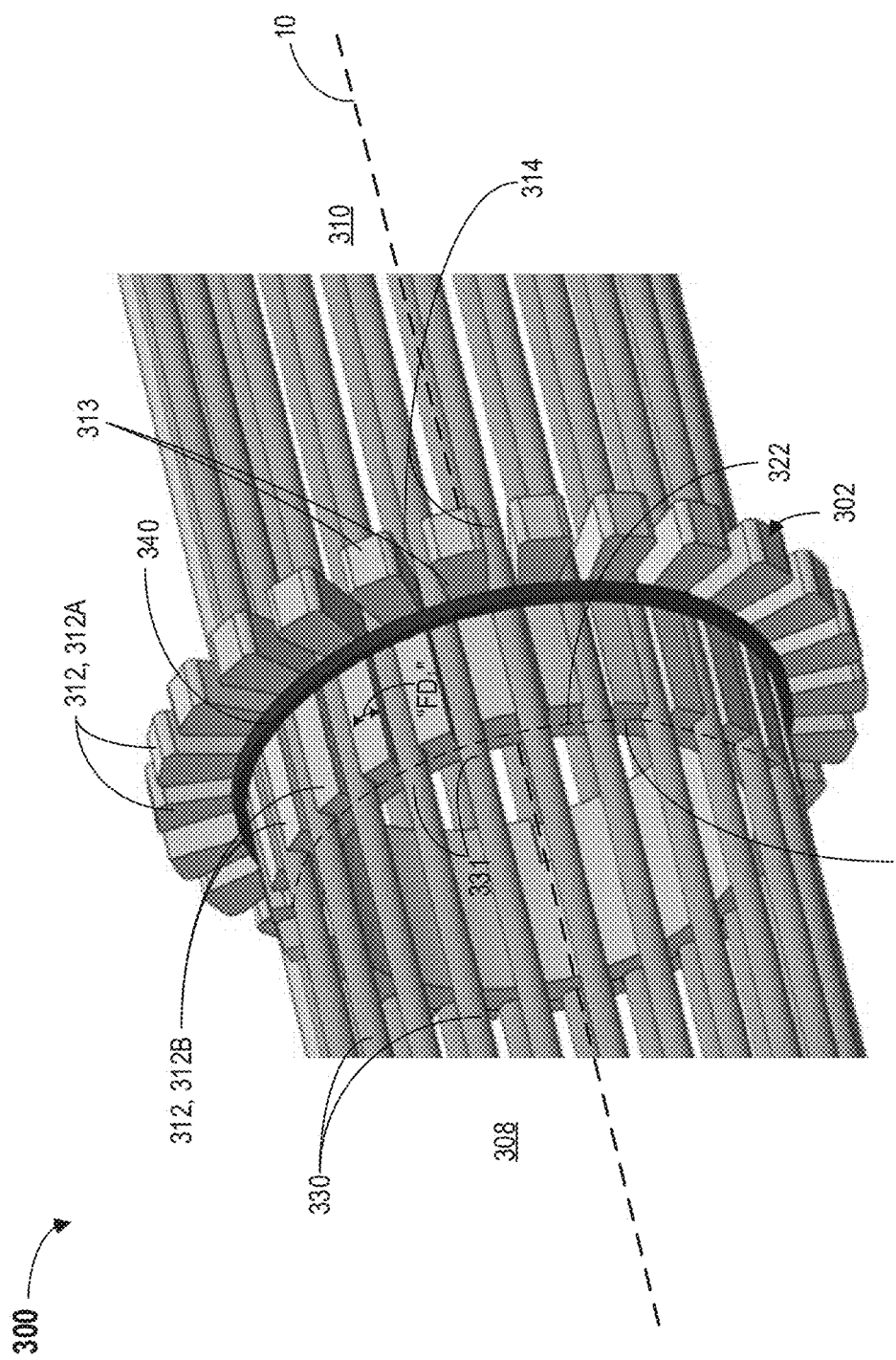
FIG. 7 illustrates a perspective rear view of a cable management component of a crosstalk regulator having a gasket according to an example of the present disclosure.

FIG. 7 depicts a perspective rear view of a cable management component 302 of a crosstalk regulator 300. The cable management component 302 includes a ring portion 304 surrounding a central axis 10 and a plurality of teeth 312 protruding radially outward from the ring portion 304. The teeth 312 defines the plurality of slots 314 distributed around a circumference 322 of the ring portion 304. Each of slots 314 is defined between a pair of adjacent teeth 313 of the plurality of teeth 312 and extends parallel to the central axis 10. Further, each of the teeth 312 includes a first portion 312A and a second portion 312B. The first portion 312A protrudes farther radially outward from the ring portion 304 than the second portion 312B. Each slot of the plurality of slots 314 receives one cable of a plurality of cables 330, while maintaining a fixed distance "$FD_1$" between adjacent cables 331 of the plurality of cables 330 to regulate crosstalk among the plurality of cables 330. In some examples, the cable management component 302 further includes a gasket 340 disposed circumferentially over the second portion 312B of each tooth in the plurality of teeth 312 contacting the first portion 312A of each tooth in the plurality of teeth 312. The gasket 340 holds the plurality of cables 330 within a corresponding slot of the plurality of slots 314 and prevent leakage of a fluid (air) between a controlled environment 308 and the external environment 310. The gasket 340 may be utilized in any of the examples disclosed herein, including the examples illustrated in FIGS. 1-6G and 8A-9.

FIG. 8A depicts a cross-sectional side view of a cable management component 402 of a crosstalk regulator 400, FIG. 8B depicts a side view of a second cable management component 452 of the crosstalk regulator 400, and FIG. 8C-8F depicts a plurality of steps for slidably disposing and interlocking the second cable management component 452 of FIG. 8B with the cable management component 402 of FIG. 8A. In the description hereinafter, FIGS. 8A-1E are described concurrently for ease of illustration. In FIGS. 8B-8E, the cable management component 402 is shown as a transparent structure to depict movement of the second cable management component 452 inside the cable management component 402, and such illustration should not be construed as a limitation of the present disclosure.

Referring to FIG. 8A, the cable management component 402 may include a ring portion 404 surrounding a central axis 10 (as labeled in FIGS. 4-5) and a plurality of teeth 414 protruding radially outward from the ring portion 404. The teeth 414 defines the plurality of slots (not shown) distributed around a circumference 422 (as shown in FIG. 8C) of the ring portion 404. Each of slots is defined between a pair of adjacent teeth of the plurality of teeth 414 and extends parallel to the central axis 10. Further, each of the teeth 414 includes a first portion 414A and a second portion (not shown in FIG. 1A). The first portion 414A protrudes farther radially outward from the ring portion 404 than the second portion 412B. The ring portion 404 includes a bore 406 having an inner surface 408 and an outer surface (not shown in FIG. 8A). The inner surface 408 includes a plurality of grooves 428, each protruding radially inwards relative to the central axis 10 and extends from the first end portion 418 towards the second end portion 420 for a predefined first axial length. In the example of FIG. 8A, each groove of the plurality of grooves 428 has an "S-shaped" profile. For example, the "S-shaped" groove 428 has a first axial leg "$AL_1$", a circumferential leg "AC", and a second axial leg "$AL_2$". Further, each of the legs of the "S-shaped" groove 428 has a width "W". In some examples, the plurality of grooves 428 may provision a second cable management component 452 (as shown in FIG. 8B) to be interlocked with the cable management component 402. The cable management component 402 further includes an insertion slot 426 (as shown in FIG. 8C) formed between an outermost circumference (not labeled) and an inner circumference (not labeled) of the ring portion 404. The insertion slot 426 extends parallel to the central axis 10 between the first end portion 418 and the second end portion 420 of the cable management component 402.

Referring to FIG. 8B, the second cable management component 452 includes a second ring portion 454 surrounding the central axis 10 and a plurality of second teeth 462 protruding radially outward from the second ring portion 454. The second teeth 462 defines the plurality of second slots 464 distributed around a second circumference 472 (as shown in FIG. 8D) of the second ring portion 454. Each of second slots 464 is defined between a pair of second adjacent teeth of the plurality of second teeth 462 and extends parallel to the central axis 10. The second cable management component 452 further includes an insertion protrusion 476 formed on an outward facing surface of one of the second teeth 462 of the second cable management component 452. For example, the insertion protrusion 476 protrudes radially outwards from outermost surface of one of the second teeth 462 of the second cable management component 452. Further, the insertion protrusion 476 is disposed at a first end portion 468 of the second cable management component 452. The second cable management component 452 further includes a plurality of ridges 478 disposed spaced apart from each other and formed on the outward facing surface of one or more second teeth 462 of the second cable management component 452. For example, the plurality of ridges 478 protrudes radially outwards from the outermost surface of the one or more second teeth 462. Each ridge of the plurality of ridges 478 is disposed at an offset distance "OD" from the first end portion 468. Each ridge 478 has a width "$W_2$", which is equal to the width "$W_1$" of the groove 428.

Referring to FIG. 8C, the second cable management component 452 is slidably disposed within the bore 406 of the cable management component 402, as shown by reference numeral 495. In such examples, the insertion protrusion 476 of the second cable management component 452 is offsite by a circumferential distance "CD" from the insertion slot 426 of the cable management component 402. The ridge 478 is aligned and engaged with the first axial leg "$AL_1$" (as shown in FIG. 8A) of the corresponding groove 428.

Referring to FIG. 8D, the second cable management component 452 is rotated circumferentially as shown in reference numeral 496. In such examples, the insertion protrusion 476 of the second cable management component 452 is aligned with the insertion slot 426 of the cable management component 402. The ridge 478 is engaged with the circumferential leg "AC", (as shown in FIG. 8A) of the corresponding groove 428.

Referring to FIG. 8E, the second cable management component 452 is further slidably pushed along an axial direction, as shown in reference numeral 497. In such examples, the insertion protrusion 476 of the second cable management component 452 is engaged with the insertion slot 426 of the cable management component 402. The ridge 478 is engaged with the second axial leg "$AL_2$, (as shown in FIG. 8A) of the corresponding groove 428.

Referring to FIG. 8F, the second cable management component 452 slidably disposed within the cable management component 402 such that the groove 428 of the cable management component 402 is engaged with the corresponding ridge 478 of the second cable management component 452 to interlock the second cable management component 452 to the cable management component 402.

Figure 9:
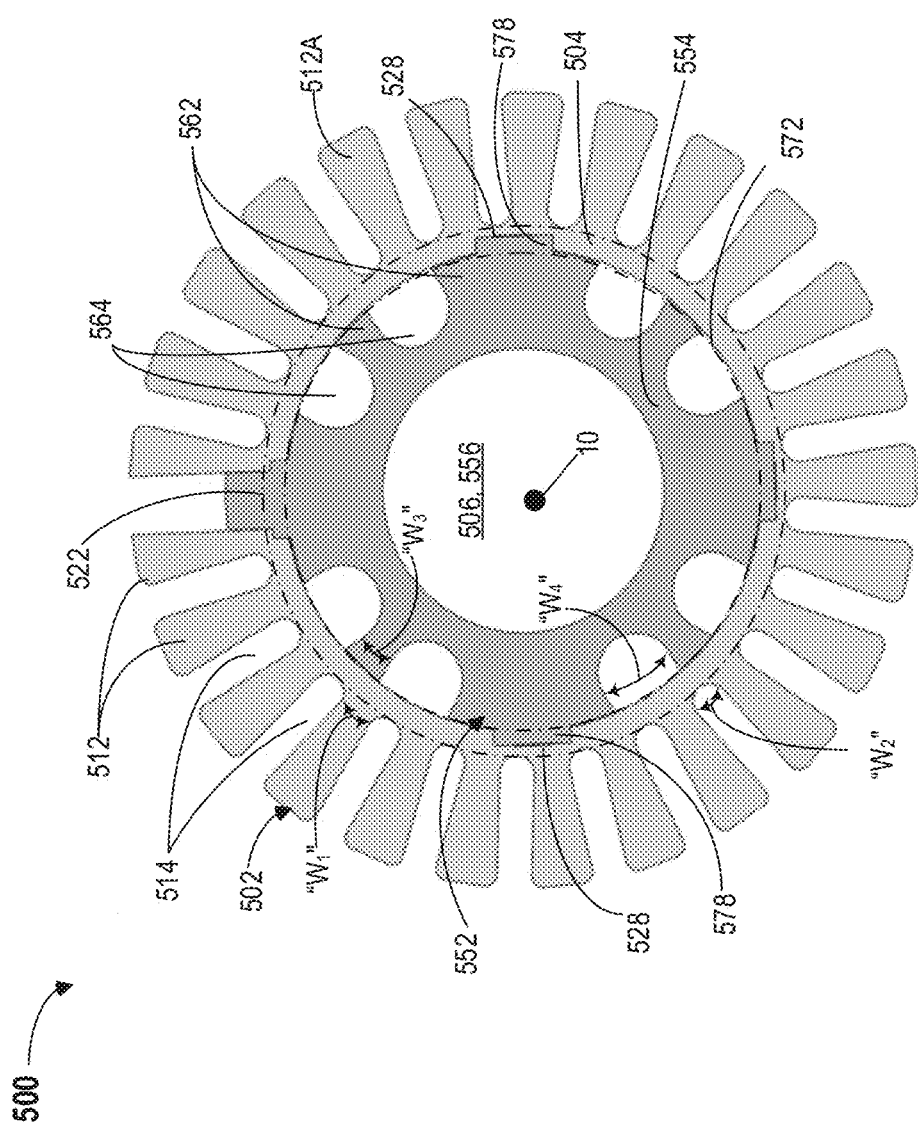
FIG. 9 illustrates a front view of a cable management component and a second cable management component of a crosstalk regulator according to another example of the present disclosure.

FIG. 9 depicts a front view of a crosstalk regulator 500 having a cable management component 502 and a second cable management component 552. In the example of FIG. 9, the second cable management component 552 is disposed within a bore 506 of the cable management component 502 such that a plurality of ridges 578 of the second cable management component 552 is engaged with a plurality of grooves 528 of the cable management component 502 to interlock the second cable management component 552 with the cable management component 502.

The cable management component 502 includes a ring portion 504 surrounding a central axis 10 and a plurality of teeth 512 protruding radially outward from the ring portion 504. The teeth 512 defines the plurality of slots 514 distributed around a circumference 522 of the ring portion 504. Each of slots 514 is defined between a pair of adjacent teeth of the plurality of teeth 512 and extends in length parallel to the central axis 10. Further, each of the teeth 512 includes a first portion 512A and a second portion 512B (not visible in FIG. 9). The first portion 512A protrudes farther radially outward from the ring portion 504 than the second portion 512B. It may be noted herein that the bottom surface of the slots 514, which corresponds to an outer surface of the cable management component 502 may be described collectively as the circumference 522 of the ring portion 504.

The second cable management component 552 includes a second ring portion 554 surrounding the central axis 10 and a plurality of second teeth 562 protruding radially outward from the ring portion 504. The second teeth 562 defines the plurality of second slots 564 distributed around a second circumference 572 of the second ring portion 554. Each of second slots 564 is defined between a pair of second adjacent teeth of the plurality of second teeth 562 and extends parallel to the central axis 10. It may be noted herein that the bottom surface of the second slots 564, which corresponds to a second outer surface of the second cable management component 552 may be described collectively as the second circumference 572 of the second ring portion 554.

Each teeth of the plurality of teeth 512 has a tooth-width "W" and each slot of the plurality of slots 514 has a slot-width "$W_2$". In some examples, the tooth-width "W" is in a range from about 13 mm to about 20 mm. In such examples, each slot of the plurality of slots 514 is configured to receive one cable of a plurality of cables (not shown), while maintaining a fixed distance "$FD_1$" (as shown in FIG. 4) between adjacent cables of the plurality of cables to regulate crosstalk among the plurality of cables. In some examples, the fixed distance "$FD_1$" may be in range from about 13 mm to about 25 mm.

Further, each second tooth of the plurality of second teeth 562 has a tooth-width "$W_3$" and each second slot of the plurality of second slots 564 has a slot-width "$W_4$". In some examples, the tooth-width "$W_3$" is in a range from about 13 mm to about 20 mm. In such examples, each second slot of the plurality of second slots 564 is configured to receive one second cable of a plurality of second cables (not shown), while maintaining a second fixed distance "$FD_2$" (as shown in FIG. 4) between second adjacent cables of the plurality of second cables to regulate crosstalk among the plurality of second cables. In some examples, the second fixed distance "$FD_2$" may be in range from about 13 mm to about 25 mm. In the example of FIG. 9, the second fixed distance "$FD_2$" is greater than the fixed distance "$FD_1$" so as to allow the second cable of greater diameter than the first cable to route between the controlled environment and the external environment. In one or more examples, the fixed distance "$FD_1$" or the second fixed distance "$FD_2$" may depend on a diameter of the cable management component 502 and the second cable management component 552, respectively.

In some examples, at least some of the plurality of cables may be a data cable such as CAT6 cable. Similarly, at least some of the plurality of second cables may be a data cable such as CAT5 cable or a power cable. In one or more examples, each second cable of the plurality of second cables may be disposed spaced apart from an adjacent cable of the plurality of cables by a third fixed distance "$FD_3$" (as shown in FIG. 4) to regulate the crosstalk between the plurality of second cables and the plurality of cables. In some examples, the third fixed distance "$FD_3$" may be in range from about 13 mm to about 20 mm.

Note that references herein to "sealing" do not necessarily require a perfect hermetic seal, unless explicitly noted otherwise or implied by the context. In particular, even when something is "sealed" some negligible amount of air may leak through it. For example, the cables 130 substantially fill the space between the slots 114 and the rim of the opening 212A and thus "seal" the holes therein, but nevertheless there may be some small gaps around the cables 130 through which some negligible amount of air may leak. In contexts where a hermetic seal is desired, sealing compounds (e.g., glue, caulking, foam, etc.) may be inserted into the slots 114 and/or gaskets (such as the gasket 340) may be used to further reduce or eliminate air leakage.

Various features as illustrated in the examples described herein may be implemented in cabinets deployed in a datacenter or other facility in which computers or other electronic devices are hosted to execute workloads, transfer data and/or store data that are related to the workloads. Moreover, although cabinets with controlled environments are one beneficial use case for the crosstalk regulators, it should be understood that the crosstalk regulators disclosed herein may be beneficially used with any structure that has an opening through which it is desired to route cables, such as a wall of a building, a case of an electronic device, or the like. Accordingly, a crosstalk regulator that is disposed in the opening of a structure (such as a cabinet) may route a plurality of cables between one side thereof (e.g., a controlled environment of the cabinet) and another side thereof (e.g., an external environment) via the opening while maintaining a fixed distance between adjacent cables to prevent crosstalk among the plurality of cables. Since the cables are adequately spaced apart from each other at the opening, the crosstalk may not occur between the cables when the data are transmitted through such cables. Hence, the cables may be able to transmit the data at high speeds without worrying about the data packet losses and/or transmission losses in the cables. Further, since the cables are held in an organized fashion and not bundled to route between the controlled and external environments, identifying one or more faulty cables from the plurality of cables, and replacing the identified one or more cables with one or more new cables may be relatively easier and less time consuming task. Since the crosstalk regulator provides a stress free path for cables to route between the two different environments (e.g., without tight bends/kinks or rubbing up against sharp edges of objects), through the opening, the cables may be less likely to get spitted at the opening due to a sealing element disposed in the opening to prevent loss/gain of temperature between the two different environments.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A crosstalk regulator comprising:
   a cable management component comprising a ring portion surrounding a central axis and a plurality of teeth protruding radially outward from the ring portion, the teeth defining a plurality of slots distributed around a circumference of the ring portion, each of slots defined between a pair of adjacent teeth of the plurality of teeth and extending parallel to the central axis, wherein the cable management component has a bore defined by the ring portion; and
   a second cable management component configured to be slidably disposed in the bore and interlocked to the cable management component, the second cable management component comprising a second ring portion surrounding the central axis and a plurality of second teeth protruding radially outward from the second ring portion,
   wherein each of the teeth comprises a first portion and a second portion, the first portion protruding farther radially outward from the ring portion than the second portion,
   wherein the cable management component is configured to be slidably disposed in an opening formed on a sidewall of a structure such that at least part of the second portion of each tooth is disposed in the opening and the first portion of each tooth is engaged to the sidewall to releasably retain the crosstalk regulator in the sidewall, and
   wherein each slot of the plurality of slots is configured to receive one cable of a plurality of cables such that the plurality of slots route the plurality of cables between an environment on one side of the sidewall and another environment on an opposite side of the sidewall while maintaining a fixed distance between adjacent cables of the plurality of cables to regulate crosstalk among the plurality of cables.

2. The crosstalk regulator of claim 1, wherein each slot and each tooth extend in length parallel to the central axis between a first end portion and a second end portion of the cable management component, and wherein the first portion of each tooth is located at the first end portion of the cable management component.

3. The crosstalk regulator of claim 1, further comprising a gasket disposed circumferentially over the second portion of each tooth contacting the first portion of each tooth to hold the plurality of cables within a corresponding slot of the plurality of slots and prevent leakage of a fluid between the environments.

4. The crosstalk regulator of claim 1, wherein the cable management component has an insertion slot formed between an outermost circumference of the ring portion and an inner circumference of the ring portion, and wherein the insertion slot extends parallel to the central axis between a first end portion and a second end portion of the cable management component.

5. The crosstalk regulator of claim 4, wherein each second slot of the plurality of second slots is configured to receive one second cable of a plurality of second cables such that the plurality of second slots route the plurality of second cables between the environments while maintaining a second fixed distance between adjacent second cables of the plurality of second cables to regulate the crosstalk among the plurality of second cables.

6. The crosstalk regulator of claim 5, wherein the plurality of second cables is inserted inside the bore via the insertion slot in the cable management component prior to disposing the second cable management component in the bore, and wherein each second cable of the plurality of second cables is disposed spaced apart from an adjacent cable of the plurality of cables by a third fixed distance to regulate the crosstalk between the plurality of second cables and the plurality of cables.

7. The crosstalk regulator of claim 6, wherein the cable management component further comprises a groove formed in an inward facing surface of the ring portion, wherein the second cable management component further comprises a ridge formed in an outward facing surface of the second ring portion, and wherein the groove is engaged with the ridge to interlock the second cable management component to the cable management component.

8. The crosstalk regulator of claim 6, wherein the second cable management component has an insertion protrusion formed in an outward facing surface of the second ring portion, and wherein the insertion protrusion is engaged to the insertion slot when the second cable management component is slidably disposed in the bore.

9. The crosstalk regulator of claim 8, wherein the second cable management component has a second bore defined by the second ring portion and the crosstalk regulator further comprises a plug configured to be disposed in the second bore such that the plug prevents leakage of a fluid between the environments.

10. The crosstalk regulator of claim 6, wherein each slot of the plurality of slots has a slot-width along a circumferential dimension of the ring portion in a range from about 13 mm to about 20 mm, wherein each tooth of the plurality of teeth has a tooth-width along the circumferential dimension of the ring portion in the range from about 13 mm to about 20 mm, wherein each second slot of the plurality of second slots has a second slot-width along a second circumferential dimension of the second ring portion in a second range from about 13 mm to about 25 mm, wherein each second tooth of the plurality of second teeth has a second tooth-width along the second circumferential dimension of the second ring portion in the second range from about 13 mm to about 25 mm, wherein the fixed distance is about 13 mm to about 25 mm, wherein the second fixed distance is about 13 mm to about 25 mm, and wherein the third fixed distance is about 13 mm to about 20 mm, wherein each cable of the plurality of cables and the plurality of second cables is a data cable.

11. A cabinet of a datacenter, comprising:
a sidewall having an opening;
a plurality of cables; and
a crosstalk regulator comprising:
a cable management component having a ring portion surrounding a central axis and a plurality of teeth protruding radially outward from the ring portion, the teeth defining a plurality of slots distributed around a circumference of the ring portion, each of the slots defined between a pair of adjacent teeth of the plurality of teeth and extending parallel to the central axis,
wherein each of the teeth comprises a first portion and a second portion, the first portion protruding farther radially outward from the ring portion than the second portion,
wherein the cable management component is slidably disposed in the opening such that at least part of the second portion of each tooth is disposed in the opening and the first portion of each tooth is engaged to the sidewall to releasably retain the crosstalk regulator in the cabinet, and
wherein each slot of the plurality of slots receives one cable of the plurality of cables such that the plurality of slots route the plurality of cables between a controlled environment of the cabinet and an external environment while maintaining a fixed distance between adjacent cables of the plurality of cables to regulate crosstalk among the plurality of cables.

12. The cabinet of claim 11, wherein the cable management component has a bore defined by the ring portion and an insertion slot formed between an outermost circumference of the ring portion and an inner circumference of the ring portion, and wherein the insertion slot extends parallel to the central axis between a first end portion and a second end portion of the cable management component.

13. The cabinet of claim 12, wherein the crosstalk regulator further comprises a second cable management component comprising a second ring portion surrounding the central axis and a plurality of second teeth protruding radially outward from the second ring portion, the second teeth defining a plurality of second slots distributed around a second circumference of the second ring portion, each of the second slots defined between a pair of second adjacent teeth of the plurality of second teeth and extending parallel to the central axis, and wherein each second slot of the plurality of second slots receives one second cable of a plurality of second cables such that the plurality of second slots route the plurality of second cables between the controlled environment and the external environment while maintaining a second fixed distance between adjacent second cables of the plurality of second cables to regulate the crosstalk among the plurality of second cables.

14. The cabinet of claim 13, wherein the second cable management component is slidably disposed in the bore and interlocked to the cable management component, wherein the plurality of second cables is inserted inside the bore via the insertion slot in the cable management component, and wherein each second cable of the plurality of second cables is disposed spaced apart from an adjacent cable of the plurality of cables by a third fixed distance to regulate the crosstalk between the plurality of second cables and the plurality of cables.

15. The cabinet of claim 14, wherein the cable management component further comprises a groove formed in an inward facing surface of the ring portion, wherein the second cable management component further comprises a ridge formed in an outward facing surface of the second ring portion, and wherein the groove is engaged with the ridge to interlock the second cable management component to the cable management component.

16. The cabinet of claim 14, wherein the second cable management component has an insertion protrusion formed in an outward facing surface of the second ring portion, and wherein the insertion protrusion is engaged to the insertion slot when the second cable management component is slidably disposed in the bore.

17. The cabinet of claim 16, wherein the second cable management component has a second bore defined by the second ring portion and the crosstalk regulator further comprises a plug disposed in the second bore, and wherein the plug prevents leakage of a fluid between the controlled environment and the external environment.

18. A method comprising:
routing a plurality of cables through an opening formed in a sidewall of a structure;
inserting each cable of the plurality of cables into respectively corresponding slots of a plurality of slots of a cable management component of a crosstalk regulator such that the plurality of slots route the plurality of cables between an environment on one side of the sidewall and another environment on an opposite side of the sidewall through the opening while maintaining a fixed distance between adjacent cables of the plurality of cables to regulate crosstalk among the plurality of cables,
wherein the cable management component comprises a ring portion surrounding a central axis and a plurality of teeth protruding radially outward from the ring portion, the teeth defining the plurality of slots distributed around a circumference of the ring portion, each of slots defined between a pair of adjacent teeth of the plurality of teeth and extending parallel to the central axis, and wherein each of the teeth comprises a first portion and a second portion, the first portion protruding farther radially outward from the ring portion than the second portion;
slidably disposing the cable management component in the opening such that at least a part of the second portion of each tooth of the plurality of teeth is disposed in the opening and the first portion of each tooth is engaged to the sidewall to releasably retain the crosstalk regulator in the structure; and
slidably disposing a second cable management component in a bore defined by the ring portion and interlocking the second cable management component to the cable management component,
wherein the second cable management component comprises a second ring portion surrounding the central axis and a plurality of second teeth protruding radially outward from the second ring portion, the second teeth defining the plurality of second slots distributed around a second circumference of the second ring portion, each of second slots defined between a pair of adjacent second teeth of the plurality of second teeth and extending parallel to the central axis.

19. The method of claim 18, further comprising:
routing a plurality of second cables between the environments through the opening;

inserting the plurality of second cables inside the bore through an insertion slot formed between an outermost circumference of the ring portion and an inner circumference of the ring portion prior to disposing the second cable management component in the bore, wherein the insertion slot extends parallel to the central axis between a first end portion and a second end portion of the cable management component; and inserting each cable of the plurality of second cables into respectively corresponding second slots of a plurality of second slots of a second cable management component of the crosstalk regulator such that the plurality of second slots route the plurality of second cables between the environments while maintaining a second fixed distance between adjacent second cables of the plurality of second cables to regulate the crosstalk among the plurality of second cables.

20. The method of claim 18, further comprising:

disposing a plug in a second bore defined by the second ring portion; and fastening the plug to the second cable management component to prevent leakage of a fluid between the environments.

\* \* \* \* \*